US012593641B2

(12) United States Patent
Premakumar et al.

(10) Patent No.: US 12,593,641 B2
(45) Date of Patent: Mar. 31, 2026

(54) APPARATUSES FOR CLEANING A MULTI-STATION SEMICONDUCTOR PROCESSING CHAMBER

(71) Applicant: Lam Research Corporation, Fremont, CA (US)

(72) Inventors: Harish Kumar Premakumar, Bengaluru (IN); Tongtong Guo, Beaverton, OR (US); Rachel E. Batzer, Tigard, OR (US); Bo Gong, Sherwood, OR (US); Francisco J. Juarez, West Linn, OR (US); Ching-Yun Chang, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 18/701,171

(22) PCT Filed: Oct. 18, 2022

(86) PCT No.: PCT/US2022/078259
§ 371 (c)(1),
(2) Date: Apr. 12, 2024

(87) PCT Pub. No.: WO2023/069922
PCT Pub. Date: Apr. 27, 2023

(65) Prior Publication Data
US 2025/0006514 A1      Jan. 2, 2025

Related U.S. Application Data

(60) Provisional application No. 63/374,520, filed on Sep. 2, 2022, provisional application No. 63/257,009, filed on Oct. 18, 2021.

(51) Int. Cl.
H01L 21/67      (2006.01)
B08B 1/40      (2024.01)
B08B 5/02      (2006.01)

(52) U.S. Cl.
CPC .......... H01L 21/67017 (2013.01); B08B 1/40 (2024.01); B08B 5/02 (2013.01); H01L 21/67161 (2013.01)

(58) Field of Classification Search
None
See application file for complete search history.

(56) References Cited

U.S. PATENT DOCUMENTS 3,320,846 A      5/1967   Michel
D278,883 S      5/1985   Frieberg
(Continued)

FOREIGN PATENT DOCUMENTS

JP      H05190517 A      7/1993
JP      2015023138 A      2/2015
(Continued)

OTHER PUBLICATIONS

Google Patents translation of KR20080062339A (Year: 2025).*

(Continued)

*Primary Examiner* — Eric W Golightly
(74) *Attorney, Agent, or Firm* — Weaver Austin Villeneuve & Sampson LLP

(57) ABSTRACT

Disclosed are various systems that allow for plasma delivery from a central location in a multi-station processing chamber to be redirected to different processing stations within the chamber. Such systems may include a deflector plate that is mounted to a wafer indexer such that the deflector plate is centered on the wafer indexer. In other implementations, such systems may include a deflector plate that is mounted in a fixed relationship with a ceiling of the processing (Continued)

chamber. The deflector plate may have a body having a top surface and an underside surface that are on opposite sides of the body. A plurality of recesses may be arranged across the top surface in a radial pattern around a center axis.

30 Claims, 15 Drawing Sheets

(56)                    References Cited

U.S. PATENT DOCUMENTS

| | | | |
|---|---|---|---|
| 6,450,117 | B1 | 9/2002 | Murugesh et al. |
| 6,600,632 | B1 | 7/2003 | Prochazka et al. |
| D481,299 | S | 10/2003 | Fujioka |
| 6,663,025 | B1 | 12/2003 | Halsey et al. |
| D528,407 | S | 9/2006 | Schwab |
| 7,416,989 | B1 | 8/2008 | Liu et al. |
| D600,220 | S | 9/2009 | Sato |
| D692,747 | S | 11/2013 | Schwab |
| D925,480 | S | 7/2021 | Oe et al. |
| D962,183 | S | 8/2022 | Sugiura et al. |
| D962,184 | S | 8/2022 | Sugiura et al. |
| D1,053,157 | S | 12/2024 | Sato |
| D1,053,695 | S | 12/2024 | Kato et al. |
| 2005/0199184 | A1 | 9/2005 | Murugesh et al. |
| 2008/0038894 | A1 | 2/2008 | Rueger et al. |
| 2009/0127099 | A1 | 5/2009 | Mullapudi et al. |
| 2015/0030766 | A1 | 1/2015 | Lind et al. |
| 2017/0256416 | A1 | 9/2017 | Fischer et al. |
| 2018/0114700 | A1 | 4/2018 | Woo et al. |
| 2019/0341276 | A1 | 11/2019 | Chow et al. |
| 2025/0022696 | A1 | 1/2025 | Meng et al. |

FOREIGN PATENT DOCUMENTS

| | | |
|---|---|---|
| JP | 2019134124 A | 8/2019 |
| KR | 20070069122 A | 7/2007 |
| KR | 20080062339 A | 7/2008 |
| KR | 20160116476 A | 10/2016 |
| TW | 418065 | 1/2001 |
| TW | 201705185 A | 2/2017 |
| TW | D211363 S | 5/2021 |
| WO | WO-2021185915 A1 | 9/2021 |

OTHER PUBLICATIONS

CN Office Action dated Aug. 16, 2024 in CN Application No. 202280089859.7 with English translation, 2 pages.

CN Office Action dated Jan. 29, 2024 in CN Application No. 202230216489.1, with English Translation, 3 pages.

CN office action dated Jul. 20, 2023, in application No. CN202230216489.1 with English Translation, 5 pages.

International Preliminary Report on Patentability and Written Opinion dated Jun. 6, 2024 in PCT Application No. PCT/US2022/080277, 11 pages.

International Preliminary Report on Patentability and Written Opinion dated May 2, 2024 in PCT Application No. PCT/US2022/078259, 6 pages.

International Search Report and Written Opinion dated Apr. 7, 2023 in PCT Application No. PCT/US2022/080277, 7 pages.

International Search Report and Written Opinion dated Feb. 2, 2023, in Application No. PCT/US2022/078259, 10 jpages.

JP Office Action dated Oct. 7, 2022, in Application No. JP2022-008426 with English translation, 9 pages.

JP Office Action dated Oct. 7, 2022, in Application No. JP2022-008429 with English translation, 6 pages.

JP Office Action dated Oct. 7, 2022, in Application No. JP2022-008430 with English translation, 3 pages.

KR Office Action dated Nov. 28, 2022, in Application No. KR30-2022-0015219 awaiting with English translation, 4 pages.

KR Office Action dated Nov. 28, 2022, in Application No. KR30-2022-0015220 awaiting with translation, 4 pages.

KR Office Action dated Nov. 28, 2022, in Application No. KR30-2022-0015221 with English translation, 4 pages.

KR Office Action dated Nov. 28, 2022, in Application No. KR30-2022-0015222 with English translation, 4 pages.

TW Notice of Allowances dated Aug. 23, 2024 in TW Application No. 108123893 with English translation, 6 pages.

TW Office Action dated Apr. 19, 2023 in Application No. TW108123893 with English Translation, 20 pages.

TW Office Action dated Aug. 31, 2022 In Application No. TW111301839 with English translation, 3 pages.

TW Office Action dated Jul. 26, 2023 in Application No. TW108123893 with English Translation, 19 pages.

TW Office Action dated Jun. 30, 2023, in application No. TW111301837 with English translation, 6 pages.

TW Office Action dated Mar. 9, 2023 in Application No. TW111301839 With English translation, 5 pages.

TW Office Action dated Mar. 29, 2023 in Application No. TW111301838 with English translation, 6 pages.

TW Office Action dated Mar. 30, 2023, in Application No. TW111301840 with English translation, 8 pages.

U.S. Appl. No. 18/712,902, inventors Meng X., et al., filed May 23, 2024.

U.S. Appl. No. 29/811,957, Inventors Guo et al., filed Oct. 18, 2021.

EP Extended European Search report dated Sep. 26, 2025 in EP Application No. 22884629.1, 8 pages.

U.S. Ex Parte Quayle Action dated May 16, 2025 in U.S. Appl. No. 29/811,957, 8 pages.

U.S. Notice of Allowance dated Sep. 2, 2025 in U.S. Appl. No. 18/712,902, 9 pages.

U.S. Notice of Allowance dated Sep. 25, 2025 in U.S. Appl. No. 29/811,957, 8 pages.

U.S. Restriction Requirement dated Mar. 4, 2025 in U.S. Appl. No. 29/811,957, 10 pages.

KR Office Action dated Feb. 9, 2026 in KR Application No. 10-2024-7016356, with English Translation. 8 pages.

U.S. Notice of Allowance dated Dec. 23, 2025 in U.S. Appl. No. 18/712,902 . 8 pages.

U.S. Appl. No. 30/039,644, inventors Guo T et al., filed on Dec. 24, 2025.

* cited by examiner

APPARATUSES FOR CLEANING A MULTI-STATION SEMICONDUCTOR PROCESSING CHAMBER

RELATED APPLICATION(S)

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

During some semiconductor processing operations, materials are deposited and removed from semiconductor substrates positioned in a processing chamber. These materials and other unwanted particulates and contaminants can become deposited on internal surfaces and features of the processing chamber, including the chamber walls and gas distribution devices, such as a showerhead. To maintain high throughput, low contamination, low particle, and fully functioning equipment after processing wafers in the processing chamber, the accumulated unwanted materials should be cleaned from the processing chamber's internal features.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some implementations, a deflector plate for use in a semiconductor processing tool may be provided. The deflector plate may include a body having a top surface and an underside surface that are on opposite sides of the body. The deflector plate may also include a plurality of recesses in the top surface that are arranged in a radial pattern around a center axis. For each recess, that recess may be at least partially defined by a corresponding bottom surface, a corresponding first side surface, a corresponding second side surface, and a corresponding front surface. The first side surface, the second side surface, and the front surface may intersect the bottom surface, the front surface may span between the first side surface and the second side surface, and the front surface may span between the bottom surface and an outer edge of the recess that is radially outwards from the bottom surface in a direction perpendicular to the center axis and farther from the underside surface than the bottom surface in a direction parallel to the center axis.

In some implementations, each front surface may span between a corresponding outer edge and a corresponding bottom surface along a first profile having a linear section, a non-linear section, or a combination of at least one linear section and at least one non-linear section.

In some implementations, a corresponding obtuse angle may be defined between each front surface facing the center axis and a reference plane that is perpendicular to the center axis, and the obtuse angle may be between about 120 degrees and about 170 degrees.

In some implementations, the bottom surface may be substantially perpendicular to the center axis.

In some implementations, the front surface may be oriented at an acute angle with respect to the center axis and the front surface facing the center axis.

In some implementations, the acute angle may be between about 20 degrees and about 80 degrees.

In some implementations, the front surface may intersect with the bottom surface at a first edge having a radius, and the radius may be between about 1 inch and about 0.1 inches.

In some implementations, the first side surface may be oriented with respect to the bottom surface at a first angle, the second side surface may be oriented with respect to the bottom surface at the first angle, and the first angle may be between about 60 degrees and about 100 degrees.

In some implementations, the first side surface and second side surface may be substantially parallel to each other.

In some implementations, the first side surface may intersect with the bottom surface at a first edge having a second radius, and the second side surface may intersect with the bottom surface at a second edge having the second radius.

In some implementations, the second radius may be between about 0.1 inches and about 0.01 inches.

In some implementations, the first side surface may intersect with the front surface at a third edge having a third radius, and the second side surface may intersect with the front surface at a fourth edge having the third radius.

In some implementations, the third radius may be between about 0.1 inches and about 0.01 inches.

In some implementations, the front surface may be planar.

In some implementations, the front surface may be curved.

In some implementations, the front surface may be convex with respect to the center axis.

In some implementations, the plurality of recesses may include four recesses substantially equally spaced about the center axis.

In some implementations, each recess may be further defined by a first back surface and a second back surface, the first back surface may span between the bottom surface and a first inner edge of the recess that is radially inwards from the bottom surface in a direction perpendicular to the center axis and farther from the underside surface than the bottom surface in a direction parallel to the center axis, and the second back surface may span between the bottom surface and a second inner edge of the recess that is radially inwards from the bottom surface in a direction perpendicular to the center axis and farther from the underside surface than the bottom surface in a direction parallel to the center axis.

In some implementations, each recess may be further defined by a first back surface and a second back surface, the first back surface may intersect with the first side surface and the bottom surface, the second back surface may intersect with the second side surface and the bottom surface, the first back surface and the second back surface may be offset from, and may not intersect, each other, the first back surface may be oriented at an obtuse angle with respect to the center axis, and the second back surface may be oriented at the obtuse angle with respect to the center axis.

In some implementations, the obtuse angle may be between about 95 degrees and about 165 degrees.

In some implementations, the first back surface may intersect with the first side surface at a first corner that is curved, and the second back surface may intersect with the second side surface at a second corner that is curved.

In some implementations, the deflector plate may further include a plurality of channels. Each channel may intersect with a corresponding recess, each channel may be interposed between the center axis and the corresponding recess, each channel may include a channel bottom surface, a first channel side surface, and a second channel side surface, the first channel side surface may intersect with the channel bottom surface and the first back surface of the recess, the second channel side surface may intersect with the channel bottom surface and the second back surface of the recess, and the channel bottom surface may intersect with the bottom surface of the recess.

In some implementations, each channel may have a rectangular cross-sectional area.

In some implementations, each recess may have a recess width between the first side surface and the second side surface, each channel may have a channel width between the first channel side surface and the second channel side surface, and the channel width may be less than the recess width.

In some implementations, the first back surface may span between the bottom surface and a first inner edge of the recess that is radially inwards from the bottom surface in a direction perpendicular to the center axis and farther from the underside surface than the bottom surface in a direction parallel to the center axis.

In some implementations, each recess may be further defined by a back surface, the back surface may intersect with and span between the first side surface and the second side surface, and the back surface may span between the bottom surface and an inner edge of the recess that is radially inwards from the bottom surface in a direction perpendicular to the center axis and farther from the underside surface than the bottom surface in a direction parallel to the center axis.

In some implementations, each recess may be further defined by a back surface, the back surface may intersect with and span between the first side surface and the second side surface, the back surface may intersect with the bottom surface, and the back surface may be oriented at an obtuse angle with respect to the center axis.

In some implementations, the deflector plate may further include a center through-hole that is centered on the center axis.

In some implementations, a multi-station semiconductor processing apparatus may be provided. The multi-station semiconductor processing apparatus may include a processing chamber having a plurality of processing stations positioned therein and arranged in a circular array around a center region. The multi-station semiconductor processing apparatus may further include a cleaning gas distribution nozzle positioned in the center region of the processing chamber and having a nozzle inlet, a plurality of nozzle outlets, and a plurality of nozzle flowpaths that fluidically connect each nozzle outlet to the nozzle inlet. The multi-station semiconductor processing apparatus may also have a deflector plate having a plurality of recesses in a top surface, each recess being at least partially defined by a corresponding bottom surface, a corresponding first side surface, a corresponding second side surface, and a corresponding front surface. The front surface may span between the bottom surface and an outer edge of that recess that is radially outwards from the bottom surface in a direction perpendicular to a center axis of the deflector plate and farther from an underside surface of a body than the bottom surface in a direction parallel to the center axis. The nozzle outlets and the deflector plate may be fluidically connected with the processing chamber and processing stations, the cleaning gas distribution nozzle may be configured to direct a cleaning gas flow onto the deflector plate, and the deflector plate may be positioned underneath the cleaning gas distribution nozzle such that a cleaning gas flowed onto each recess is configured to flow into a corresponding processing station.

In some implementations, the deflector plate and cleaning gas distribution nozzle may be positioned such that the cleaning gas flowing through the nozzle inlet flows onto each recess and into each processing station.

In some implementations, the multi-station semiconductor processing apparatus may further include a wafer indexer and the deflector plate may be a part of the wafer indexer.

In some implementations, the multi-station semiconductor processing apparatus may further include a plurality of robot arms that are each configured to handle a wafer and each recess may be positioned between two corresponding robot arms.

In some implementations, the cleaning gas distribution nozzle may further include a stem with an inner cavity that fluidically connects the nozzle inlet with the plurality of nozzle outlets.

In some implementations, each nozzle outlet may be positioned radially outwards from the inner cavity in a direction perpendicular to the center axis, each nozzle outlet may be positioned offset from the inner cavity in a direction parallel to the center axis, and each nozzle flowpath may span between the inner cavity and a corresponding nozzle outlet.

In some implementations, each nozzle outlet may be oriented at an obtuse angle with respect to a center axis of the cleaning gas distribution nozzle.

In some implementations, the obtuse angle may be between about 100 degrees and about 160 degrees.

In some implementations, the multi-station semiconductor processing apparatus may further include a cleaning gas source fluidically connected to the nozzle inlet.

In some implementations, the cleaning gas source may be a plasma source.

In some implementations, the cleaning gas may include a fluorine plasma.

In some implementations, the multi-station semiconductor processing apparatus may further include a vertical movement mechanism configured to cause relative vertical movement between the cleaning gas distribution nozzle and the deflector plate, cause the cleaning gas distribution nozzle and the deflector plate to be offset from each other by a first distance during a processing operation, and cause the cleaning gas distribution nozzle and the deflector plate to be offset from each other by a second distance large than the first distance during a cleaning operation.

In some implementations, each processing station may have a corresponding substrate support structure and showerhead having a faceplate surface that faces the substrate support structure, and increasing an offset distance between the cleaning gas distribution nozzle and the deflector plate increases a distance between the faceplate surface and the deflector plate.

In some implementations, the second distance may be between about 0.75 inches and about 1.25 inches.

In some implementations, an apparatus may be provided for use in semiconductor processing. The apparatus may include a nozzle body, one or more nozzle inlets, a plurality of nozzle outlet passages, and one or more deflector surfaces fixed in space with respect to the nozzle body. The nozzle body may have a center axis, each nozzle outlet passage may be fluidically connected to at least one of the one or more nozzle inlets, the plurality of nozzle outlet passages may be interposed between the one or more nozzle inlets and the one or more deflector surfaces, the one or more deflector surfaces may face towards the one or more nozzle inlets, and each deflector surface may have a corresponding outer edge that is radially outward, when viewed along the center axis, of a circle circumscribing the outlet passages.

In some implementations, each nozzle outlet passage may be oriented at an oblique angle with respect to the center axis of the nozzle body and oriented away from the nozzle inlet.

In some such implementations, the angle between the center axis and each nozzle outlet passage may be about 100 degrees to about 160 degrees.

In some implementations, the nozzle may have four nozzle outlets.

In some implementations, a cooling passage portion may extend through at least part of the nozzle body.

In some such implementations, the cooling passage portion may include a cooling passage inlet and a cooling passage outlet, the cooling passage inlet and the cooling passage outlet may be located in the nozzle body and may be adjacent to one or more riser passages within the nozzle body, and each of the one or more riser passages may be fluidically interposed between at least one of the one or more nozzle inlets and at least one of the plurality of nozzle outlet passages.

In some alternate such implementations, the apparatus may further include one or more nozzle cavities that may be fluidically interposed between at least one of the one or more nozzle inlets and at least one of the plurality of nozzle outlet passages, and the cooling passage portion may have an annular or annular sector shape within the nozzle body and may be adjacently located to where the plurality of nozzle outlet passages connects to one or more riser passages.

In some implementations, the deflector surface may be provided by a ceramic material.

In some implementations, the deflector surface may be provided by a material comprising aluminum.

In some implementations, the apparatus may further include a plurality of ribs, each rib circumferentially interposed between an adjacent pair of deflector surfaces.

In some such implementations, each rib may have a top surface that is substantially perpendicular to the center axis.

In some implementations, a first reference plane may be substantially perpendicular to the center axis of the nozzle body and coincident with at least a portion of the deflector surface, and may be about 0.10 inches to about 0.50 inches away from a nozzle outlet.

In some implementations, a first reference plane may be substantially perpendicular to the center axis of the nozzle body and coincident with at least a portion of the deflector surface, and may be about 0.10 inches to about 0.20 inches away from a nozzle outlet.

In some implementations, each of the one or more deflector surfaces may be at least partially defined by a corresponding bottom surface and a corresponding front surface. In such implementations, the corresponding front surface and the corresponding bottom surface of each deflector surface may intersect, and the corresponding front surface may span between the outer edge and the corresponding bottom surface of each deflector surface.

In some implementations, each front surface may span between the outer edge and the corresponding bottom surface along a corresponding first profile oriented at an oblique angle with respect to the center axis, the corresponding first profile of each deflector surface having a linear section, a non-linear section, or a combination of at least one linear section and at least one non-linear section.

In some implementations, a corresponding obtuse angle may be defined between at least a portion of each front surface facing the center axis and a reference plane that is perpendicular to the center axis, and the obtuse angle may be between about 120 degrees and about 170 degrees.

In some implementations, each corresponding bottom surface may be substantially perpendicular to the center axis.

In some implementations, the front surface may intersect with the bottom surface at a first edge having a radius and the radius may be between about 1 inch and 0.1 inches.

In some implementations, the front surface may be planar.

In some implementations, the front surface may be curved.

In some implementations, the front surface may be convex with respect to the center axis.

In some implementations, the apparatus may further include a processing chamber having a plurality of processing stations arranged in a circular array around a center region, and the nozzle body may be positioned in the center region.

In some implementations, the nozzle body may be configured to rotate about the center axis relative to the processing chamber.

In some implementations, the nozzle body may be configured to rotate by up to 90.°

In some implementations, the apparatus may further include a cleaning chemistry source fluidically connected to at least one of the one or more nozzle inlets.

In some implementations, the cleaning chemistry source may be a remote plasma generator configured to generate a plasma.

In some implementations, the cleaning chemistry may include a plasma formed using at least one or more of fluorine, oxygen, hydrogen, and nitrogen trifluoride.

BRIEF DESCRIPTION OF THE DRAWINGS

The various implementations disclosed herein are illustrated by way of example, and not by way of limitation, in the figures of the accompanying drawings, in which like reference numerals refer to similar elements.

DETAILED DESCRIPTION

Figure 1A:
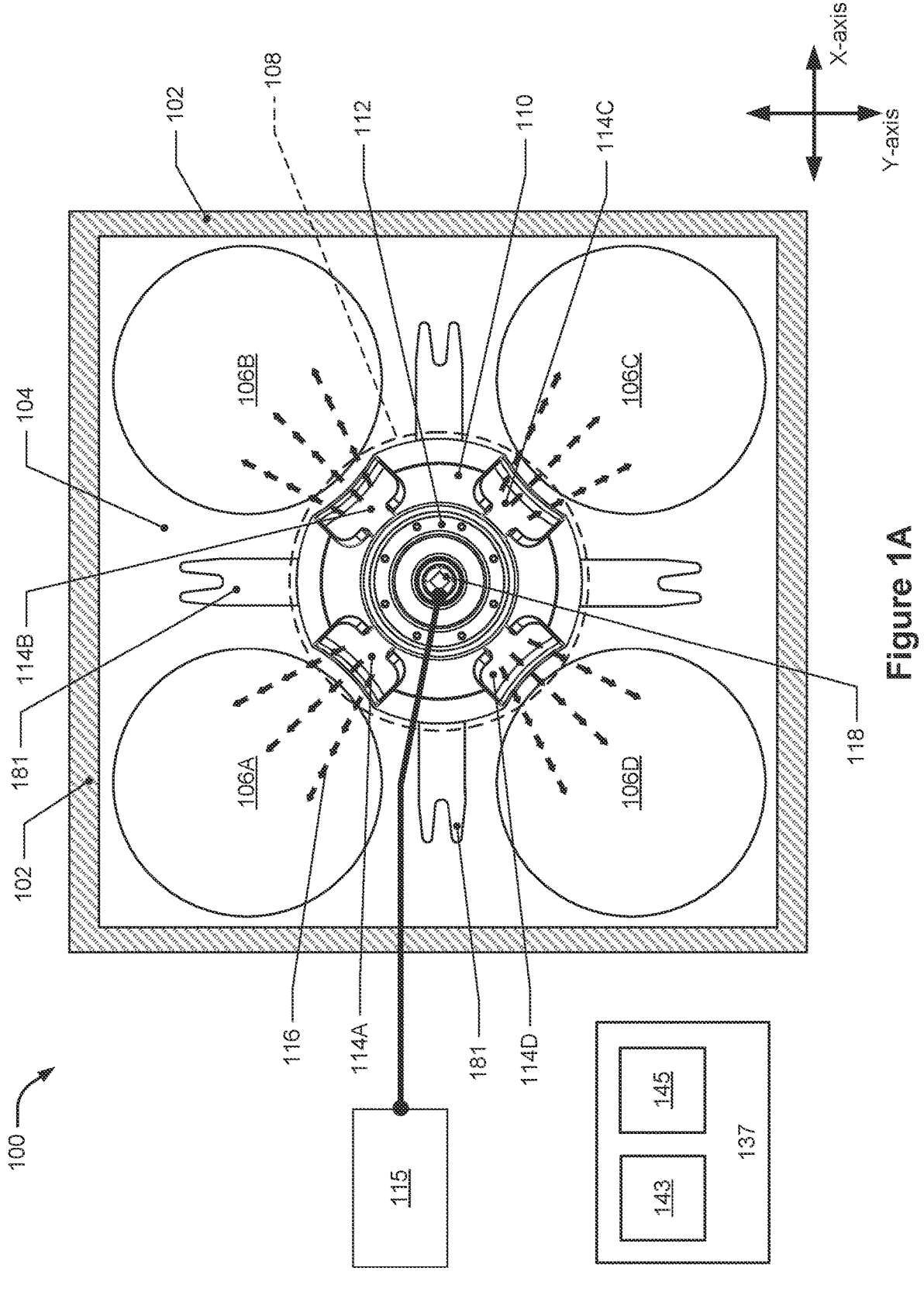
FIG. 1A depicts a top view of a multi-station processing chamber according to disclosed embodiments.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Definitions

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the embodiments are implemented for use with such a wafer. However, the description is not so limited. The work piece may be of various shapes, sizes, and materials. In addition to semiconductor wafers, other work pieces that may take advantage of these embodiments include various articles such as printed circuit boards, magnetic recording media, magnetic recording sensors, mirrors, optical elements, micro-mechanical devices and the like.

For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

Introduction and Context

Multi-station semiconductor processing tools ("multi-station tools") have two or more processing stations within a single processing chamber which can lead to numerous advantages, such as increasing throughput by enabling parallel processing of multiple wafers while at the same time utilizing common processing equipment between the various stations. For instance, in a chamber with four processing stations, four substrates placed in the four separate stations may be processed at the same time.

Cleaning processes in processing stations and chambers are important to maintaining the life expectancy of the equipment, decreasing operation cost, preventing particle contamination on wafer processing, and maintaining high throughput of wafers. Shorter clean times and more efficient cleaning methods are critical to various stages of processing wafers in integrated circuit fabrication. Unwanted residue and other deposited material can accumulate on the processing chamber's walls and top surface, as well as various surfaces of each processing station, such as the showerhead faceplate and pedestal, for example. Some showerhead faceplates have non-planar geometries and configurations that can make them difficult to clean, such as a combination of planar surfaces, holes, nozzles, and other flow dispersion elements.

Additionally, or alternatively, the configurations of some multi-station processing chambers make cleaning operations more difficult, time consuming, or impracticable. In some instances, the elements and components upstream from the processing chamber may not be able to withstand exposure to the cleaning chemistries. For example, some cleaning chemistries flow a plasma, such as a fluorine plasma, and many materials used for components upstream of a processing chamber are unable to withstand this chemistry without unacceptable damage. This can include structures made of metals or dielectric materials, such as a quartz.

Further, the configurations of some showerheads, or other gas dispersion device for flowing process gases into the processing chamber, may prevent or adversely affect the cleaning chemistry flowed therethrough into a processing station of the multi-station chamber. For instance, some showerheads may have a plurality of distribution holes that have an opening and/or bore diameter that can restrict a plasma flow through the showerhead and can adversely affect the plasma that does pass through such a restriction. Gas flowpaths through some showerheads may also result in unacceptable levels of back pressure upstream of the showerhead when flowing the cleaning chemistry. For instance, it was discovered that flowing a plasma through some showerheads into a processing chamber with a low pressure (e.g., 1 Torr), resulted in a back pressure upstream of the showerhead of at least one order of magnitude greater than the chamber pressure (e.g., 40 or 50 Torr), which can adversely affect and damage upstream components of a fluid delivery system and processing chamber.

The present inventors discovered that flowing cleaning chemistry into a multi-station chamber through a central location using a cleaning gas distribution nozzle that directs the cleaning chemistry onto a deflector plate which in turn directs the cleaning chemistry into each processing station efficiently and effectively cleaned the processing stations. The present inventors further discovered that flowing the cleaning chemistry onto a deflector plate with a plurality of recesses that are at least partially defined by a bottom surface, sidewalls, and an angled front surface advantageously caused the cleaning chemistry to flow into each processing station at a semi-upwards angle which quickly and effectively cleaned the surfaces of each station, including the showerhead surfaces. As used herein "cleaning chemistry" includes a cleaning fluid, a cleaning gas, and/or a cleaning plasma such as a fluorine plasma that is reactive with the deposition film/material to be cleaned; these terms may be used synonymously herein. For example, cleaning chemistries may include a plasma formed from one or more of hydrogen (H2), fluorine (F2), oxygen (O2), and/or nitrogen trifluoride (NF3) gas, optionally with one or more inert gases, such as argon (Ar), added. Cleaning chemistries may also include radicals, such as fluorine, oxygen, and/or hydrogen radicals that may have been produced by, for example, a remote plasma (although in such cleaning chemistries, the plasma and/or ions resulting therefrom may not reach the deflector plates discussed herein, leaving behind the aforementioned radicals, which may be delivered to the deflector plates discussed herein.

Apparatuses

Aspects of this disclosure pertain to a deflector plate configured to direct cleaning chemistry, such as a plasma gas, at an upwards angle into each station of a multi-station processing chamber, as well as a cleaning gas distribution nozzle configured to flow the cleaning chemistry onto the deflector plate. This nozzle and deflector plate are both positioned in a relatively central location of the processing chamber. The deflector plate is positioned underneath the nozzle, and the nozzle is configured to flow the cleaning chemistry at a downwards angle (e.g., a downwards vector that has both horizontal and vertical directional components) onto the deflector plate. The cleaning gas distribution nozzle includes an inlet for receiving the cleaning chemistry and a central flowpath that splits into a plurality of flowpaths and nozzle outlets that are each configured to direct the cleaning chemistry onto a corresponding recess of the deflector plate. Each deflector plate recess has side surfaces, a bottom surface, and an angled front surface that are configured to receive the cleaning chemistry and direct it at an upwards angle (e.g., an upwards vector that has both horizontal and vertical directional components) towards the showerhead of the respective processing station.

FIG. 1A depicts a top view of a multi-station processing chamber according to disclosed embodiments. The multi-station processing chamber 100 here includes chamber side walls 102 that at least partially define a chamber interior 104, as well as four processing stations 106A-106D positioned within the chamber interior 104 and arranged in a circular array. The multi-station processing chamber 100 as an area at the center of the chamber, referred to as a center region 108 and indicated by the dashed circle. A deflector plate 110 and cleaning gas distribution nozzle 112 (hereinafter referred to as the "nozzle") are positioned in this center region 108 of the multi-station processing chamber 100 with the nozzle 112 above the deflector plate 110. The deflector plate 110 includes four recesses 114A-D that each correspond with a processing station 106A-D, respectively. As described in more detail below, the nozzle 112 is configured to flow cleaning chemistry onto the deflector plate 110 which is configured to direct that flow into each processing station 106A-D. FIG. 1 also depicts illustrative lateral flows of the cleaning chemistry in the X-Y plane from the recesses 114A-D into each station 106A-D with arrows 116.

The nozzle 112 of the multi-station processing chamber 100 also includes a nozzle inlet 118 that is configured to be fluidically connected to a cleaning chemistry source 115, such as a remote plasma source that may include a fluorine plasma, for example. The nozzle 112 is configured to receive the cleaning chemistry through the nozzle inlet 118 and direct the cleaning chemistry into the chamber interior 104, onto the deflector plate 110 and into each processing station 106A-D.

Figure 1B:
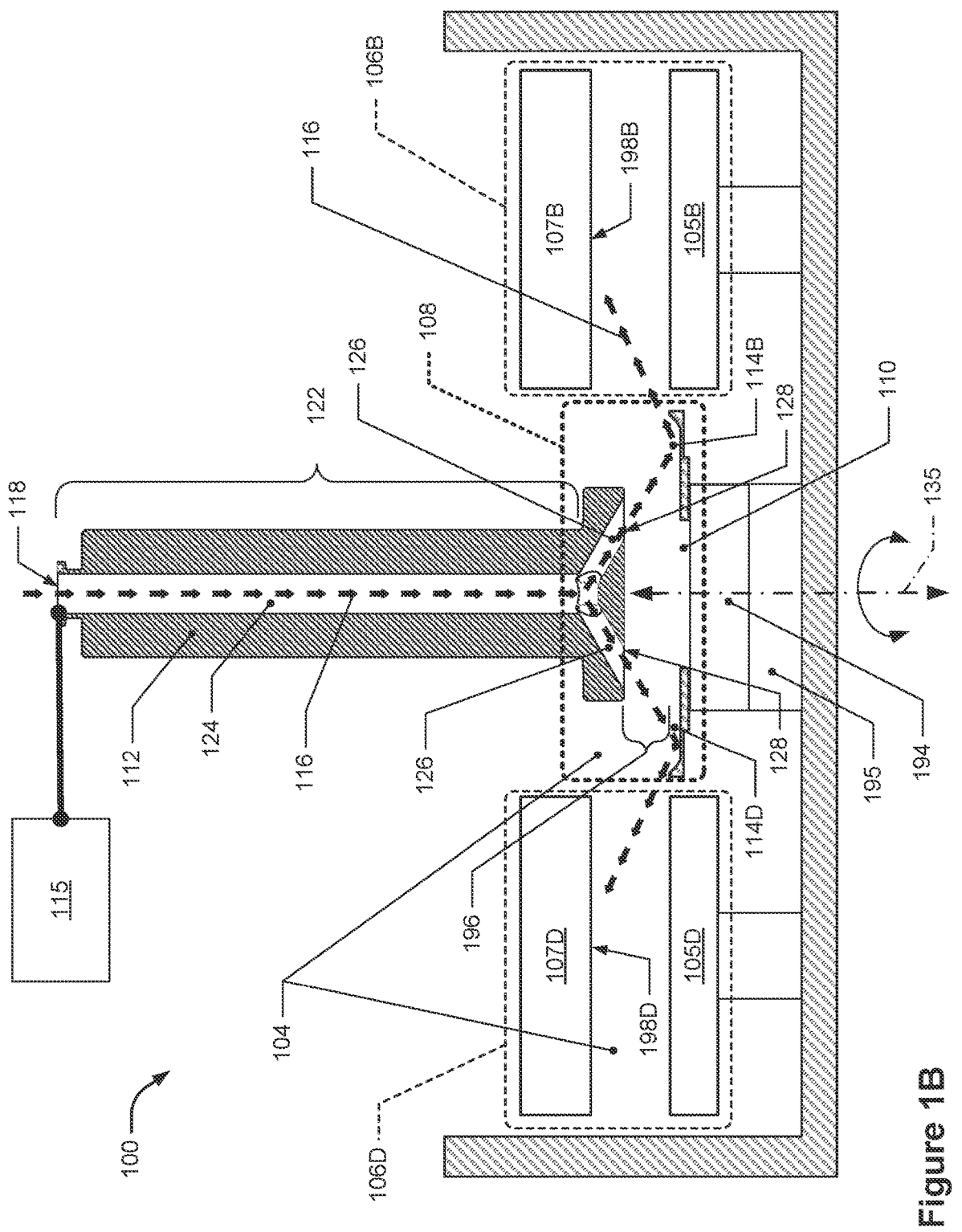
FIG. 1B depicts a cross-sectional side view of the processing chamber of FIG. 1A taken along a corner-to-corner diagonal of the chamber.

FIG. 1B depicts a cross-sectional side view of the processing chamber of FIG. 1A taken along a corner-to-corner diagonal of the chamber. The side walls 102 and bottom 109 of the multi-station processing chamber 100 are shown and for clarity, the top portion of the multi-station processing chamber 100 is not shown. Two processing stations are illustrated, which may be considered the stations across from each other with respect to the center of the multi-station processing chamber 100, such as processing stations 106B and 106D as shown, or processing stations 106A and 106C. Each processing station 106B and 106D includes a pedestal 105B and 105D, respectively, and a showerhead 107B and 107D, respectively. Each showerhead 107B and 107D has a face 198B and 198D that faces the pedestal 105B and 105D, respectively, and it is this face, among other surfaces, onto which the apparatuses herein are configured to flow cleaning chemistry. The deflector plate 110 is positioned in the chamber interior 104 and in the center region 108 of the multi-station processing chamber 100, and underneath the nozzle 112 by a non-zero offset distance 196. In some embodiments, like in FIG. 1B, the nozzle 112 and the deflector plate 110 may be separate from each other.

Additional features of the nozzle 112 are visible, such as a nozzle stem 122 with a cavity 124 that fluidically connects the nozzle inlet 118 with a plurality of nozzle flowpaths 126 and a plurality of nozzle outlets 128. Each nozzle flowpath 126 is fluidically connected to the cavity 124 of the nozzle stem 122, spans between the cavity 124 and one corresponding nozzle outlet 128, and fluidically connects one nozzle outlet 128 to the cavity 124. As indicated by arrows 116, the cleaning chemistry is configured to flow from the cleaning chemistry source 115 into the chamber interior 104 by flowing to and through the nozzle inlet 118, through the cavity 124, through each nozzle flowpath 126, and through each nozzle outlet 128. The configuration of the nozzle 112 and the positioning of the deflector plate 110 with respect to the nozzle 112 are also configured to cause the cleaning chemistry to flow onto the deflector plate 110 recesses, such as 114D and 114B in FIG. 1B. As also seen, the cleaning chemistry flows through a portion of the chamber interior 104 from each nozzle outlet 128 to the deflector plate 110. The deflector plate 110 is further configured to direct and deflect the cleaning chemistry into each processing station at an upwards angle as illustrated by the arrows 116 in FIG. 1B. This may include, in some implementations, cleaning chemistry flowing from one nozzle outlet 128 onto one deflector plate recess which in turn directs the cleaning chemistry into one processing chamber.

Figure 2A:
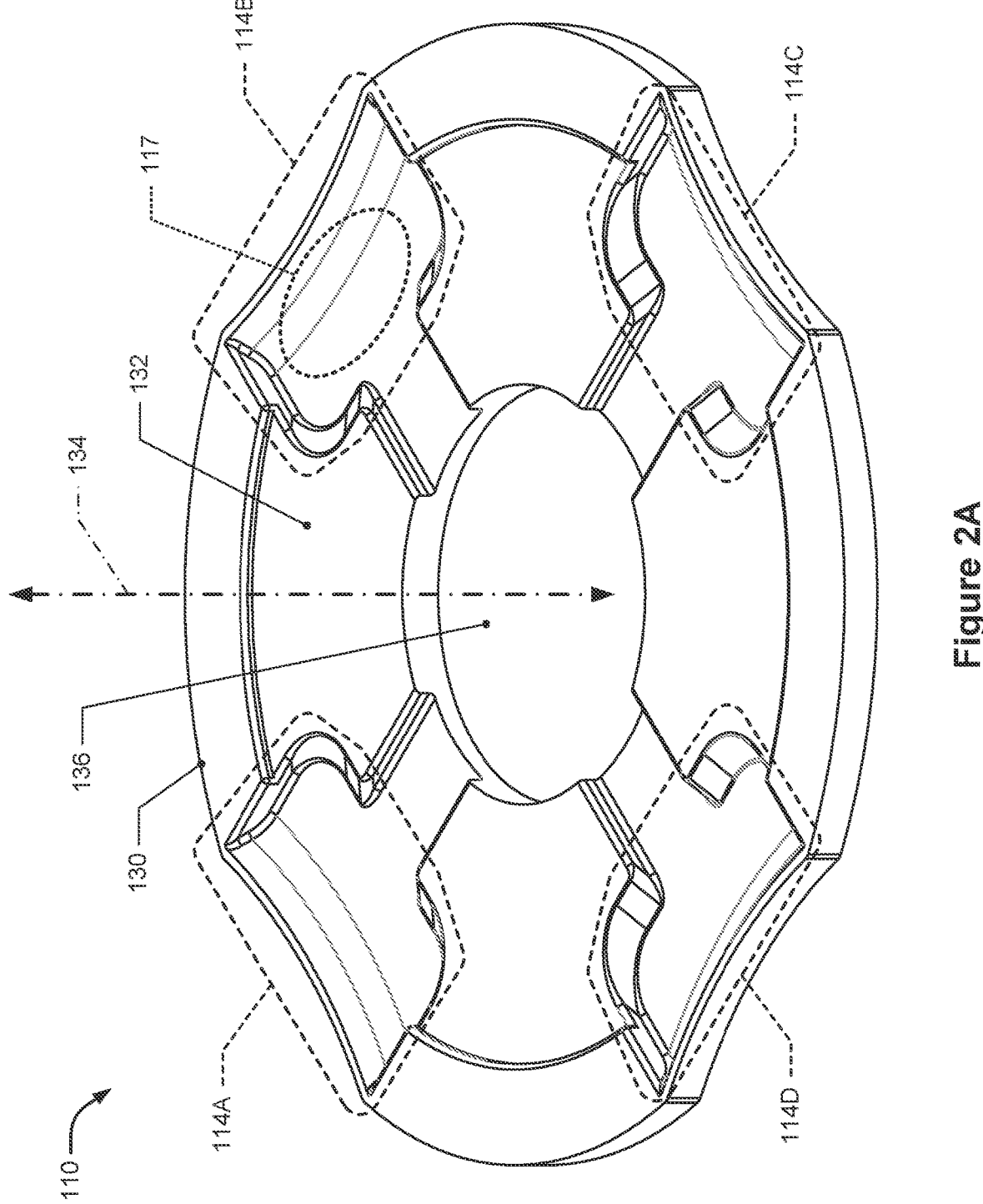
FIG. 2A depicts an off-angle view of a deflector plate in accordance with disclosed embodiments.

Additional details and configurations of the deflector plate will now be discussed. FIG. 2A depicts an off-angle view of a deflector plate in accordance with disclosed embodiments. The deflector plate 110 includes a body 130 with a top surface 132 and an underside surface (not visible in this Figure) on the opposite side of the body 130, and a center axis 134 extending through the body 130. In some implementations, as shown here, the top surface 132 may be perpendicular, or substantially perpendicular (e.g., within 10% of perpendicular), to the center axis 134. As illustrated, the body 130 may have an annular, disc shape with a through-hole 136 in the center; this through-hole 136 may be centered on the center axis 134 of the body 130. The top surface 132 of the deflector plate 110 includes a plurality of recesses 114A-D, such as four as illustrated in FIG. 2A, that are encompassed within the dashed shapes. In some implementations, the number of recesses in the deflector plate may match the number of processing stations in the processing chamber.

Figure 2B:
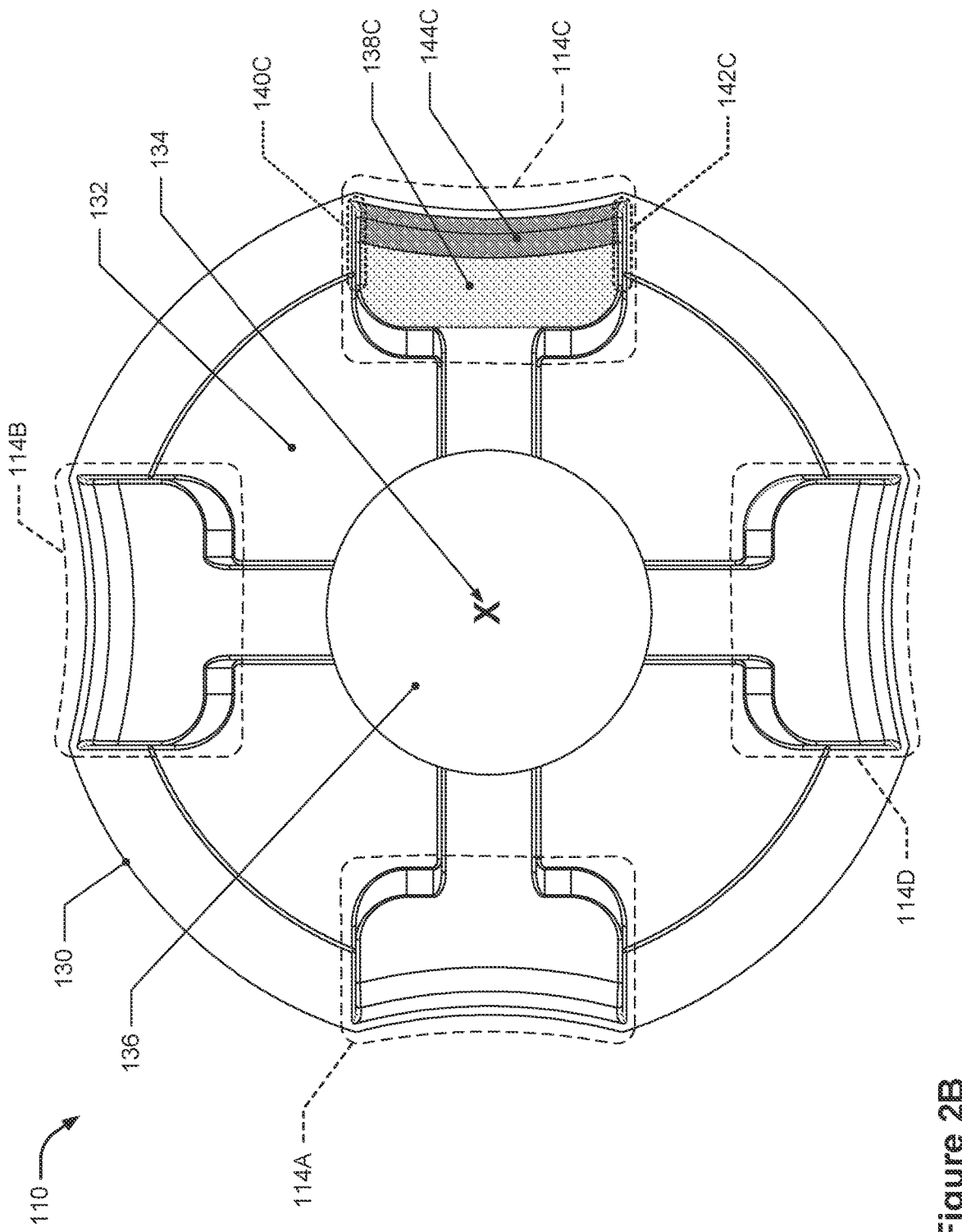
FIG. 2B depicts a top view of the deflector plate of FIG. 2A.

FIG. 2B depicts a top view of the deflector plate of FIG. 2A. Here, the center axis 134 is perpendicular to the plane of the Figure. The four recesses 114A-D are arranged around the center axis 134, such as equally, or substantially equally (e.g., within 10% of equal), spaced around the center axis 134. This arrangement may also be considered the recesses 114A-D being arranged in a radial pattern around the center axis 134. As discussed in more detail below, each recess is at least partially defined by a bottom surface 138C, a first side surface 140C, a second side surface 142C, and a front surface 144C that, in some implementations, may be referenced or defined as being angled at an acute angle with respect to the center axis 134 and/or as being angled at an obtuse angle with respect to that recess's bottom surface 138C. In some implementations, the front surface may be defined as a surface that spans between the bottom surface and an outer edge of that recess that is positioned radially outwards from the bottom surface in a direction perpendicular to the center axis and positioned farther from the body underside surface than the body bottom surface in a direction parallel to the center axis. FIG. 2B illustrates at least some of these recess features with recess 114C, such that the bottom surface 138C is identified with light shading, the first side surface 140C is encompassed within ellipse 140C, the second side surface 142C is encompassed within ellipse 142C, and the front surface 144C is identified with dark shading.

The features of the recesses are described in more detail below with respect to the single recess 114C. However, it will be understood that all the features and configurations described with respect to recess 114C are equally applicable to all the other recesses 114A, B, and D of the deflector plate. These recesses are configured to be the same, or substantially the same, as each other but while efforts may be made to manufacture them the same as each other, manufacturing tolerances and imperfections may cause them to be slightly different and therefore substantially the same, e.g., within about 10% of each other.

Figures 2C, 2D:
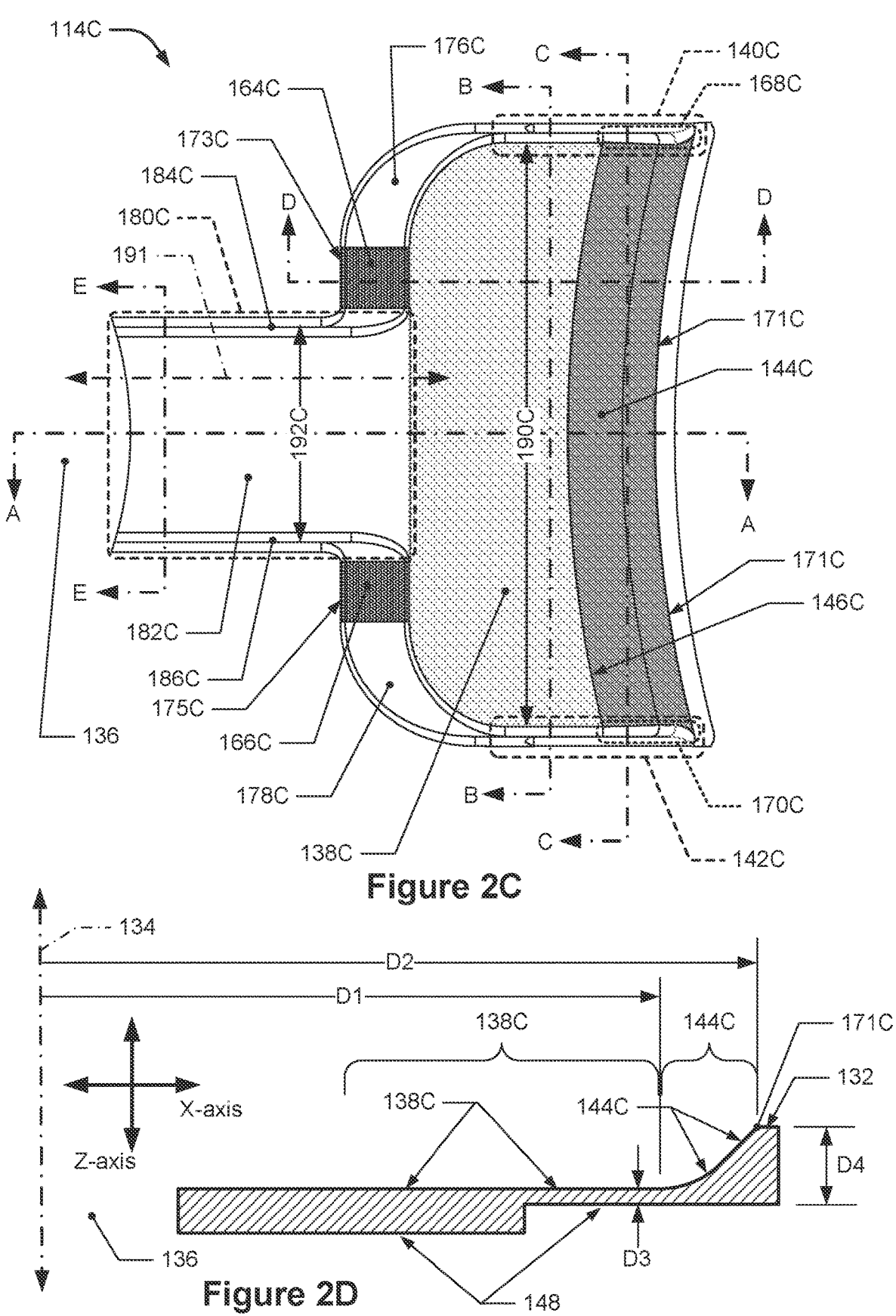
FIG. 2C depicts a top view of a magnified single recess of FIG. 2B.
FIG. 2D depicts a cross-sectional side view slice of the recess of FIG. 2C along line A-A of FIG. 2C.

These recess features are more visible in FIG. 2C which depicts a top view of a magnified single recess of FIG. 2B. The first side surface 140C and the second side surface 142C form at least a part of the boundary of the recess 114C and intersect the bottom surface 138C as well as the front surface 144C. In some embodiments, as shown in FIG. 2C, the first side surface 140C and the second side surface 142C may be parallel, or substantially parallel (e.g., within 10% of parallel) with each other. The front surface 144C also forms at least a part of the boundary of the recess 114C, intersects with the bottom surface 138C, and spans between the first side surface 140C and the second side surface 142C. In some embodiments, when viewed along the center axis 134 as depicted in FIG. 2C, the front surface 144C may be curved in a plane perpendicular to the center axis 134 of the deflector plate 110. This curvature may be convex or concave with respect to the center axis 134, such as convex as illustrated in FIG. 2C, as well as FIGS. 2A and 2B; one convex curve 146C is identified in FIG. 2C. In some other implementations, the front surface may be planar.

As noted above, the front surface may be defined in various manners, such as being oriented at an acute angle with respect to the center axis, and/or spanning between the bottom surface and an edge of the recess that is both radially outwards from the bottom surface and farther from the body underside surface than the bottom surface. FIG. 2D depicts a cross-sectional side view slice of the recess of FIG. 2C along line A-A of FIG. 2C. Here, a section of the bottom surface 138C and a section of the front surface 144C are seen along with a portion of the top surface 132, a portion of the underside surface 148 (on the opposite side of the body 130), and the center axis 134. In some embodiments, as illustrated, the front surface 144C may be defined as a front surface that spans between the bottom surface 138C and an outer edge 171C of that recess 114C. This outer edge 171C is positioned radially outwards from the bottom surface 138C and is positioned farther away from the center axis 134 than the bottom surface 138C. The bottom surface 138C may be positioned away from the center axis 134 in a direction perpendicular to the center axis 134 (e.g., the x-axis) by a distance D1 and the outer edge 171C may be positioned away from the center axis 134 in the direction perpendicular to the center axis 134 by a distance D2 that is greater than the distance D1. Similarly, the bottom surface 138C may be positioned away from the underside surface 148 in a direction parallel to the center axis 134 (e.g., the z-axis) by a distance D3 and the outer edge 171C may be positioned away from the center axis 134 in the direction parallel to the center axis 134 by a distance D4 that is greater than the distance D3. The front surface 144C spans between the recess's outer edge 171C and the bottom surface 138C, and may do so along various profiles and paths. This may include a linear path or a path having both linear and non-linear, e.g., curved, sections (the front surface 144C in FIG. 2D includes both one linear section and one non-linear section which is referenced below as the non-linear edge 152 with radius R2), for example.

Figure 2E:
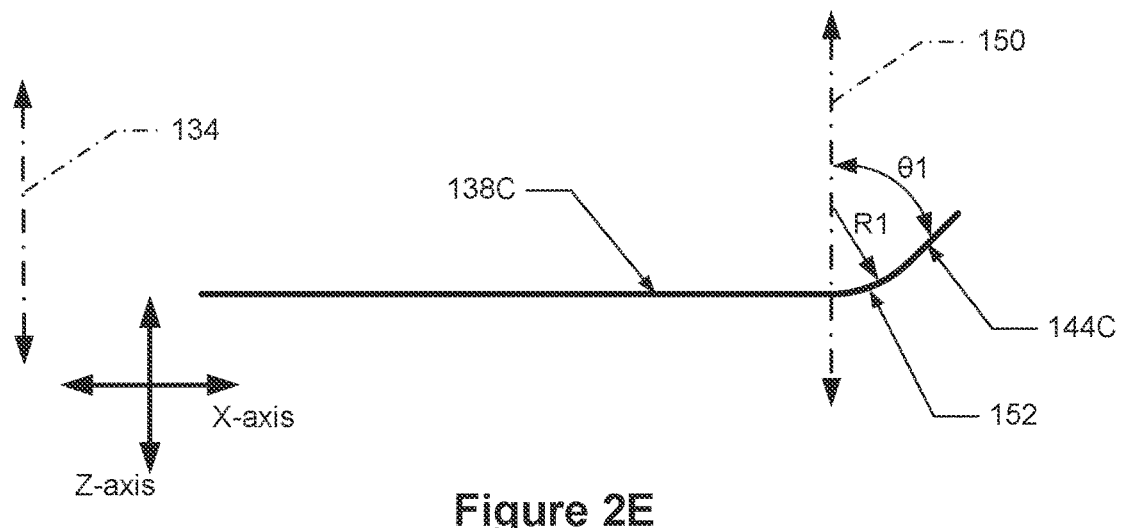
FIG. 2E depicts the profile of the recess of FIG. 2D.

For further clarity, some recess configurations are further illustrated in FIG. 2E which depicts the profile of the recess of FIG. 2D; the recess profile is depicted in a heavy solid line. In some embodiments, as shown in FIG. 2E, the bottom surface 138C of the recess 114C is oriented at a perpendicular, or substantially perpendicular (e.g., within 10% of perpendicular), to the center axis 134. As noted above, in some implementations the front surface 144C may be defined as being oriented at an acute angle $\theta 1$ with respect to the center axis 134, or with respect to a referential axis 150 that is parallel to the center axis 134. The acute angle may also be considered as referenced between the center axis 134 (or referential axis) and the front surface 144C that faces the center axis 134. The acute angle $\theta 1$ may range between about 20 degrees and about 80 degrees or between about 30 degrees and about 60 degrees, for example. The front surface 144C intersects with the bottom surface 138C at an edge 152 (also identified in FIGS. 2B-D) that may be curved with a radius R1. In some implementations, this radius may range between about 2 inches and about 0.05 inches, between about 1 inch and about 0.1 inch, or between about 0.7 inches and about 0.25 inches, for example. In some implementations, the edge 152 may be considered sharp such that it has no, or a negligible or nominal, about of curvature.

Figure 2F:
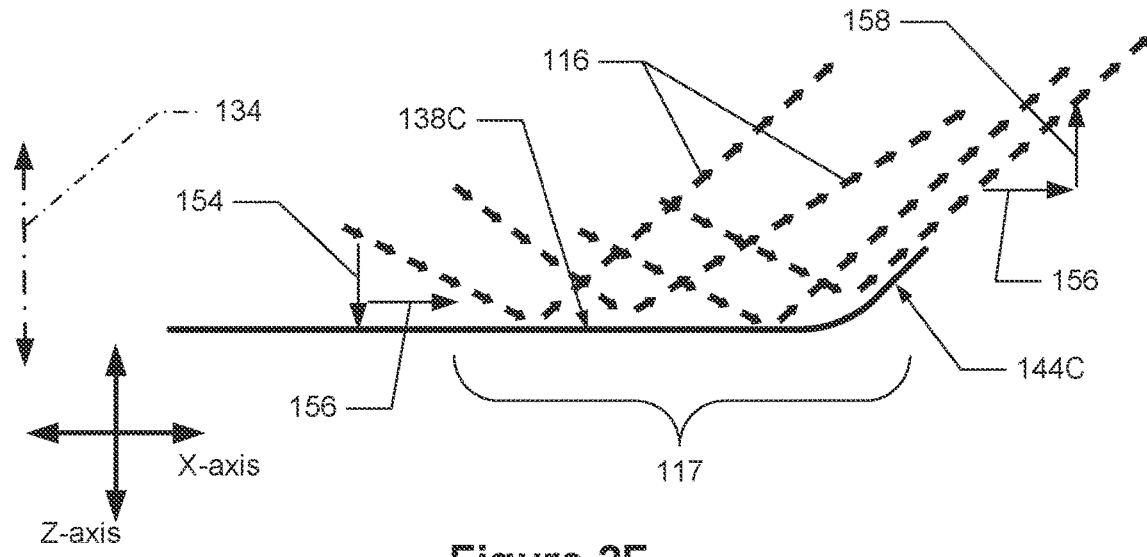
FIG. 2F depicts the profile of the recess of FIG. 2E and illustrative cleaning chemistry flows.

As noted herein, the acute angle θ1 of the front surface 144C assists with directing the cleaning chemistry into a corresponding processing station. In FIG. 2F, which depicts the profile of the recess of FIG. 2E, illustrative cleaning chemistry flows 116 are also shown. The cleaning chemistry 116 flows in a general, relative downwards direction, or vector, from the nozzle (not shown) onto the deflector plate 110 such that this flow has both a vertical directional component 154, i.e., a negative or downwards component, in a direction parallel to the center axis 134 (or to the z-axis) and a horizontal directional component 156 in a direction perpendicular to the center axis 134 (or to the x-axis) and away from the center axis 134. As illustrated, the cleaning chemistry is configured to flow onto the bottom surface 138C and the front surface 144C a general, approximate area 117; this area 117 is also shown in FIG. 2A. The acute angle θ1 of the front surface 144C causes, at least in part, the cleaning chemistry flow 116 to flow in a general upwards and radially outwards direction (or vector), e.g., away from the center axis 134, into the corresponding processing station and onto that station's showerhead. The general vector of this flow 116 has both a vertical directional component 158, i.e., a positive or upwards component, in a direction parallel to the center axis 134 (or to the z-axis) and a horizontal directional component 156 in a direction perpendicular to the center axis 134 (or to the x-axis) and away from the center axis 134. It will be understood that these vectors and directional components may be considered the average nominal, or general, vectors of the cleaning chemistry flows because these flows are gas and/or fluid flows are imprecise by nature.

Figure 2G:
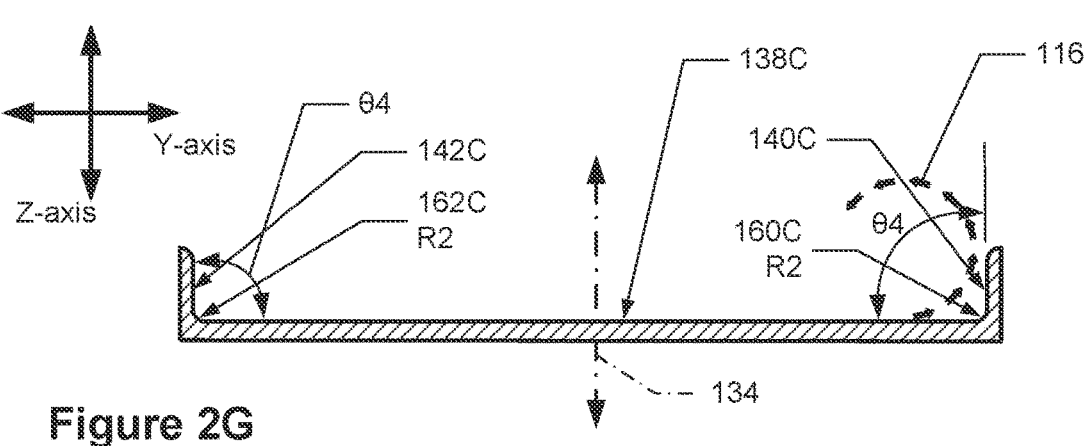
FIG. 2G depicts a cross-sectional side view slice of the recess of FIG. 2C along line B-B of FIG. 2C.

Referring back to FIG. 2C, the first side surface 140C and the second side surface 142C each intersect with the bottom surface at an edge, respectively. In some implementations, these edges may be rounded and/or these sides surfaces may be oriented at various angles with respect to the center axis 134. FIG. 2G depicts a cross-sectional side view slice of the recess of FIG. 2C along line B-B of FIG. 2C. As can be seen, the first side surface 140C intersects with the bottom surface 138C at a first edge 160C with a radius R2 and the second side surface 142C intersects with the bottom surface 138C at a second edge 162C with the radius R2. In some implementations, this radius R2 may range between about 0.5 inches and about 0.01 inches, between about 0.1 inches and about 0.01 inches, or between about 0.1 inches and about 0.01 inches.

As also illustrated in FIG. 2G, the first side surface 140C and the second side surface 142C are oriented at an angle parallel, or substantially parallel (e.g., within 10% of parallel), to the center axis 134 when viewed at an angle perpendicular to the center axis 134. The side surface orientations may also be measured with respect to the bottom surface 138C; as shown, the first side surface 140C and the second side surface 142C are both oriented at an angle θ4 with respect to the bottom surface 138C which may be a perpendicular, or substantially perpendicular (e.g., within 10% of perpendicular), angle. The configuration of these side surfaces assists with directing the cleaning chemistry flow into the corresponding processing station by, for example, at least partially confining the flow to the recess and creating flow turbulence including flow vortices that may advantageously distribute and mixing the flow chemistry. For example, the cleaning chemistry may be caused to flow outwards towards the side surfaces, then upwards, and then downwards and inwards in a general spiral-like flow pattern as shown with flow 116 in FIG. 2G.

Figure 2H:
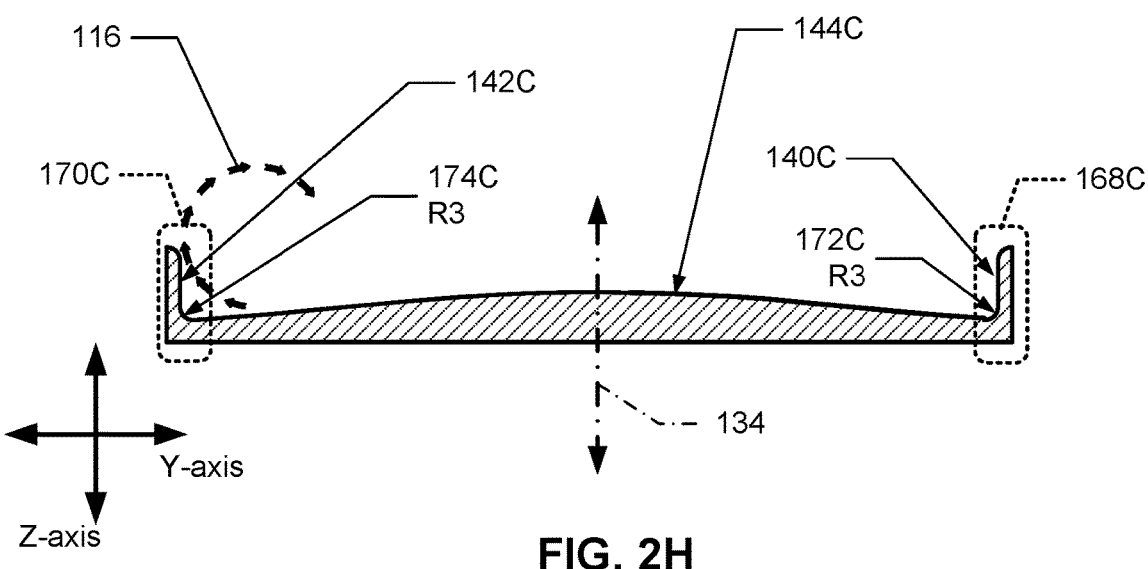
FIG. 2H depicts a cross-sectional side view slice of the recess of FIG. 2C along line C-C of FIG. 2C.

The first side surface 140C and the second side surface 142C also intersect with the front surface 144C. Referring again back to FIG. 2C, the first side surface 140C intersects with the front surface 144C at a first region 168C and the second side surface 142C intersects with the front surface 144C in a second region 170C. FIG. 2H depicts a cross-sectional side view slice of the recess of FIG. 2C along line C-C of FIG. 2C. As can be seen, the first side surface 140C intersects with the front surface 144C at a first edge 172C in the first region 168C with a radius R3 and the second side surface 142C intersects with the front surface 144C in the second region 170C at a second edge 174C with the radius R3. In some implementations, the radius R3 may be the same as R2, and in some embodiments, the radius R3 may range between about 0.5 inches and about 0.01 inches, between about 0.1 inches and about 0.01 inches, or between about 0.1 inches and about 0.01 inches.

As further illustrated in FIG. 2H, the front surface 144C may be curved in a direction parallel to center axis 134. Here, the front surface 144C curves upwards with an apex higher than its sides, i.e., it is convex. In some other implementations, the front surface may not have any curve while in other embodiments, the front surface may have a concave shape such that its sides are higher than its bottom. In these areas, the configuration of the side surfaces again assists with directing the cleaning chemistry flow into the corresponding processing station by, for example, at least partially confining the flow to the recess and creating flow turbulence including flow vortices that may advantageously distribute and mixing the flow chemistry, including the general spiral-like flow pattern as shown with flow 116 in FIG. 2H.

In some embodiments, each recess may be further defined by one or more back surfaces. Referring to FIG. 2C, a first back surface 164C and a second back surface 166C are identified with dark shading. A first corner 176C may also span between and connect the first back surface 164C and the first side surface 140C; similarly, a second corner 178C may span between and connect the second back surface 166C and the second side surface 142C. The first corner 176C and the second corner 178C may be both curved and angled, as illustrated, in some embodiments. These two back surfaces 164C and 166C both intersect with the bottom surface 138C and may be oriented at an obtuse angle with respect to the center axis 134; these first and second back surfaces 164C and 166C also do not intersect with each other as illustrated, in some implementations.

Figure 2I:
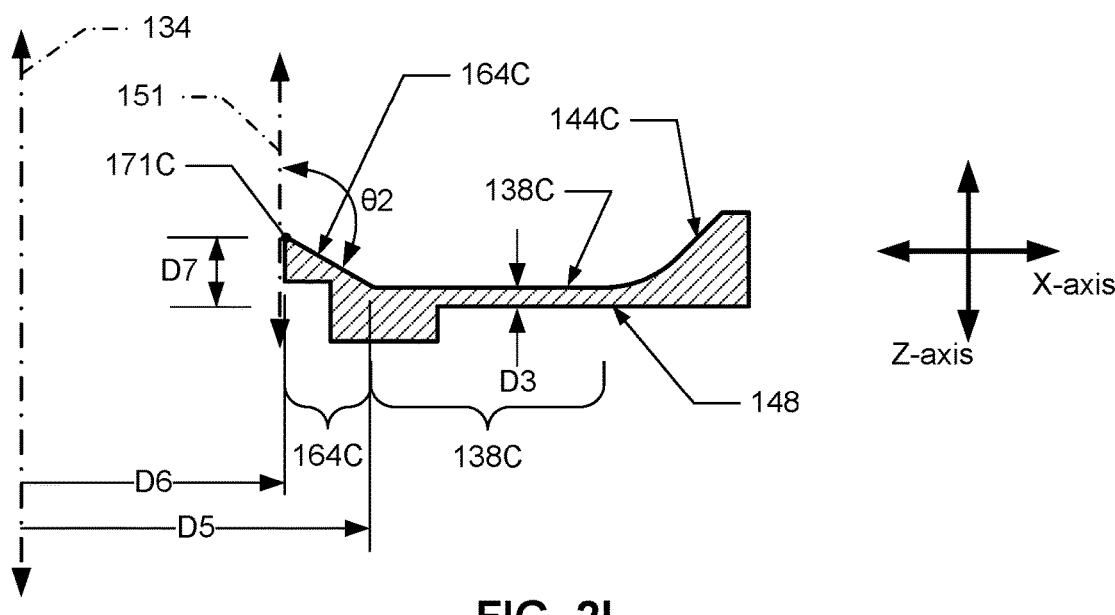
FIG. 2I depicts a cross-sectional side view slice of the recess of FIG. 2C along line D-D of FIG. 2C.

FIG. 2I depicts a cross-sectional side view slice of the recess of FIG. 2C along line D-D of FIG. 2C. Similar to the front surface, the back surfaces may be defined in various manner. For example, each first and second back surface 164C and 166C may be defined as a surface that spans between the bottom surface 138C and inner edges 173C and 175C, respectively, of that recess 114C. These inner edges 173C and 175C are positioned radially inwards from the bottom surface 138C and positioned farther away from the center axis 134 than the bottom surface 138C. As seen in FIG. 2I, the first back surface 164C spans between the bottom surface 138C and an inner edge 173C (back surface 166C spans between inner edge 175C seen in FIG. 2C). The bottom surface 138C may be positioned away from the center axis 134 in a direction perpendicular to the center axis 134 (e.g., the x-axis) by a distance D5 and the inner edge 173C may be positioned away from the center axis 134 in the direction perpendicular to the center axis 134 by a distance D6 that is less than the distance D5. Similarly, the bottom surface 138C may be positioned away from the underside surface 148 in a direction parallel to the center axis 134 (e.g., the z-axis) by a distance D3 and the inner edge 173C may be positioned away from the center axis 134 in the direction parallel to the center axis 134 by a distance D7 that is greater than the distance D3. The first back surface 164C spans between the recess's inner edge 173C and the bottom surface 138C, and may do so along various profiles and paths. This may include a linear path or a path having both linear and non-linear, e.g., curved, sections (the front surface 144C in FIG. 2I includes both one linear section and one non-linear section), for example. The second back surface 166C may be oriented and defined in the same manner as the first back surface 164C.

As can be seen, the first back surface 164C intersects with the bottom surface 138C. As noted above, in some implementations the first back surface 164C may be defined as being oriented at an obtuse angle θ2 with respect to the center axis 134, or with respect to a referential axis 151 that is parallel to the center axis 134. In some instances, this obtuse angle may be considered as referenced between center axis 134 (or referential axis 151) and the back surface that faces the front surface. The obtuse angle θ2 may range between about 95 degrees and about 165 degrees or between about 110 degrees and about 150 degrees, for example. The present inventors found that in some implementations, using an obtuse angle was more advantageous than orienting the back surface parallel, or substantially parallel (e.g., within 10% of parallel), to the center axis because the obtuse angle directed the cleaning chemistry flow with minimal to no impediment or adverse restriction of such flow. The second back surface 166C is oriented in the same manner as the first back surface 164C.

In some implementations, the deflector plate 110 may have a plurality of channels that each correspond and intersect with a recess. Each channel may extend from the center through-hole to one corresponding recess. In FIG. 2C, one of the channels 180C is seen and encompassed within the dashed rectangle. Channel 180C extends from the center through-hole 136, through the body, and to the recess 114C along an axis 191 perpendicular to the center axis 134. In some implementations, the channel may be considered a part of the recess. The channel 180C is at least partially defined by a channel bottom surface 182C, a first channel side surface 184C, and a second channel side surface 186C. In some implementations, as illustrated in FIG. 2C, the recess 114C has a recess width 190C larger than a channel width 192C of the channel 180C.

Figure 2J:
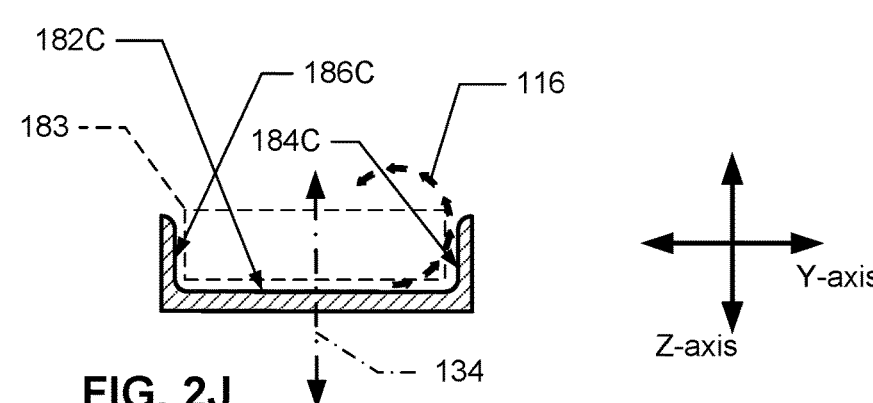
FIG. 2J depicts a cross-sectional side view slice of the channel of FIG. 2C along line E-E of FIG. 2C.

FIG. 2J depicts a cross-sectional side view slice of the channel of FIG. 2C along line E-E of FIG. 2C. As can be seen, in some instances, the nominal cross-sectional area 183 of the channel 180C may be rectangular. The first channel side surface 184C and the second channel side surface 186C may be perpendicular, or substantially perpendicular (e.g., within 10% of perpendicular), to the channel bottom surface 182C in some implementations. The channel side surface orientations may also be measured with respect to the center axis 134; as shown, the first channel side surface 184C and the second channel side surface 186C are both parallel, or substantially parallel (e.g., within 10% of parallel), to each other. The configuration of these channel side surfaces may assist with directing the cleaning chemistry flow into the corresponding processing station by, for example, at least partially confining the flow to the recess and creating flow turbulence including flow vortices that may advantageously distribute and mixing the flow chemistry, including, for example, causing the cleaning chemistry to flow outwards towards the channel side surfaces, then upwards, and then downwards and inwards in a general spiral-like flow pattern as shown with flow 116 in FIG. 2J.

The channel bottom surface 182C may also be coplanar with the bottom surface 138C and/or perpendicular with the center axis 134, in some embodiments. The channels of the deflector plate may further assist with directing the cleaning chemistry flowed onto the deflector plate radially outwards, to the angled front surface of each recess, and into the corresponding processing station. Although not labeled herein, similar to the first and second side surfaces 140C and 142C, respectively, the first channel side surface 184C and the second channel side surface 186C may both intersect with the channel bottom surface 182C at an edge having a radius that may range between about 0.5 inches and about 0.01 inches, between about 0.1 inches and about 0.01 inches, or between about 0.1 inches and about 0.01 inches.

In some other embodiments, the recess may have a single back surface instead of two back surfaces as shown in FIGS. 2A-2J, and there may be no channels. The single back surface may span between the first and second side surfaces of the recess and, in some instances, may not have a channel extending therethrough. In some embodiments, the single back surface may be oriented at an obtuse angle with respect to the center axis as described herein with the first and second back surfaces 164C and 166C.

It will be understood that all the features and configurations described above with respect to recess 114C, and including the channels, are equally applicable to all the other recesses 114A, B, and D of the deflector plate. These recesses are therefore configured the same, or substantially the same, as each other. For example, the front surface of recess 114A may the same as provided above for the front surface 144C of recess 114C.

Additional features of the processing chamber of FIGS. 1A and 1B will now be discussed. In some embodiments, as shown in FIG. 1B, the deflector plate 110 may be supported by a support structure 194 in the multi-station processing chamber 100. In some embodiments, this support structure 194 may include a plurality of robotic arms or end effectors configured to move and position a wafer in each processing station, as well as to rotate about a center axis 135 of the multi-station processing chamber 100. The rotation may, in some instances, cause the deflector plate 110 and the support structure 194 to rotate about the center axis 135.

Additionally, or alternatively, in some implementations the support structure 194 may be a part of a carousel, wafer indexer, or other wafer transportation device configured to move, or simultaneously move, a plurality of wafers between the plurality of processing stations 106A-D, such as simultaneously rotating them about the center axis 135. In some instances, the deflector plate may be positioned on, or a part of, a wafer indexer. The wafer indexer may have a plurality of robotic arms, end effectors, or other structures configured to hold and position wafers in the processing chamber. In some implementations, the wafer indexer may have the same number of robotic arms as processing chambers, and the deflector plate may also have the same number of recesses as processing chambers. Each recess may, in some embodiments, be positioned in between two robotic arms of the wafer indexer. FIG. 1A includes a plurality of robotic arms 181, e.g., four arms 181 as shown, that are each configured to hold and position one wafer. These arms 181 may be a part of a wafer indexer that is configured to rotate about the center axis 135 in FIG. 1B. These arms 181 are also arranged in a circular pattern around the center axis 135

(perpendicular to the plane of FIG. 1A) and positioned in between two recesses. As seen, each recess 114A-D is positioned between two different arms 181.

In some embodiments, the processing chamber may be configured to cause relative vertical movement between the deflector plate 110 and the nozzle 112. This may include having a movement mechanism 195 configured to move the support structure 194 on which the deflector plate 110 is positioned vertically along the center axis 135 of multi-station processing chamber 100 (or center axis of the support structure 194 which may be collinear with the center axis 135 as illustrated). In some implementations, additionally or alternatively, the nozzle 112 may be configured to move vertically along the axis 135. By causing relative motion between the deflector plate 110 and the nozzle 112, an offset distance 196 can be created which allows for the cleaning chemistry to be directed at a downwards angle onto the deflector plate which enables the gas to be directed and flowed into the respective processing stations. If this offset distance 196 is too small, then the cleaning chemistry may not flow at the proper angle, it may be too restricted and therefore lose some of its cleaning properties, such as its chemically reactive energy. If this offset distance 196 is too large, then the cleaning chemistry again may not flow at the proper angle or with enough energy to adequately clean the processing station. During a cleaning operation, the offset distance 196 may range between about 0.5 inches and 2 inches, or about 0.75 inches or about 1.25 inches, for example. During processing operations in the processing stations, the offset distance may be less, such as less than about 0.5 inches.

Figure 1C:
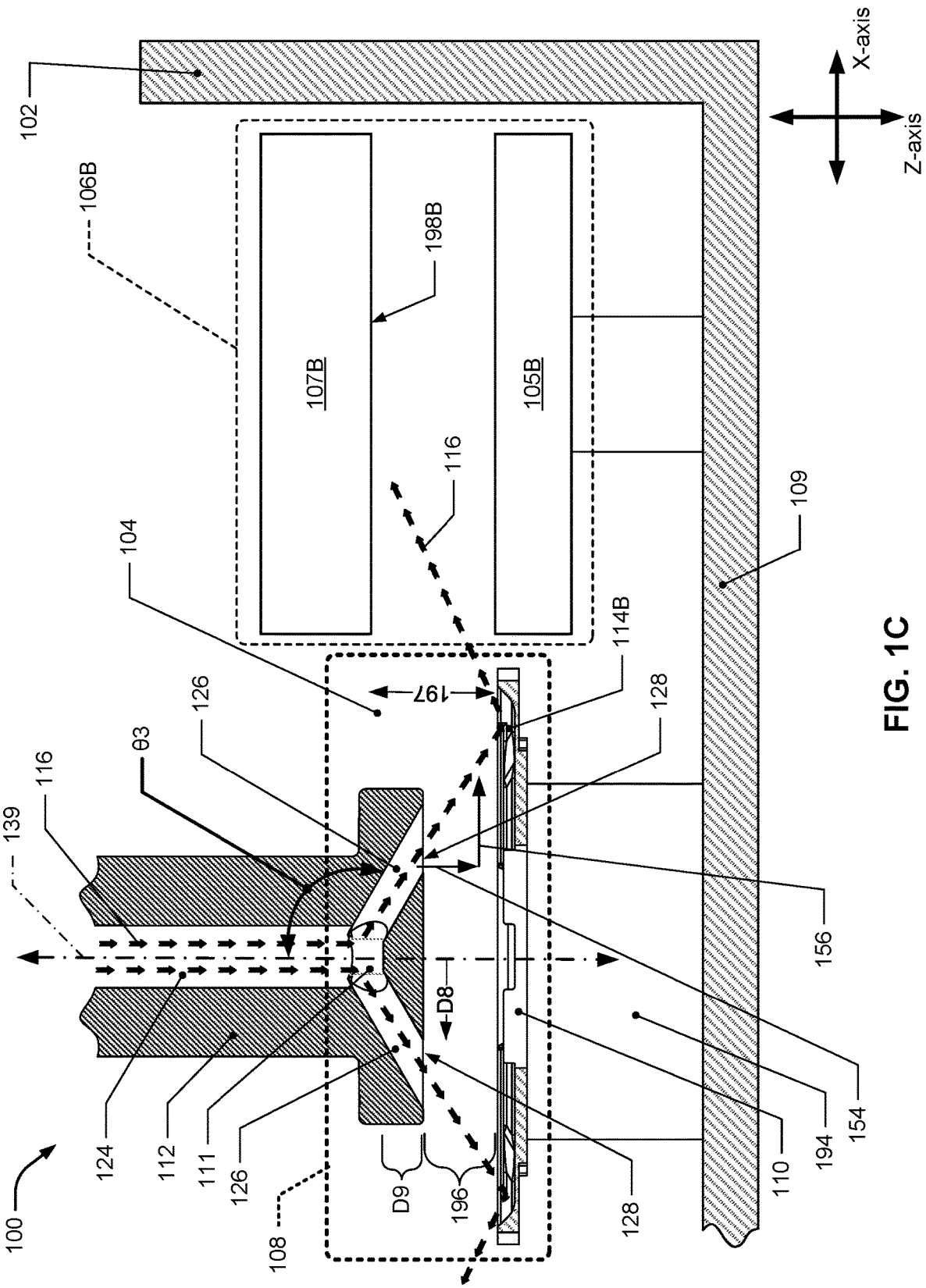
FIG. 1C depicts a magnified portion of the processing chamber of FIG. 1B.

These and additional features are discussed in FIG. 1C which depicts a magnified portion of the processing chamber of FIG. 1B. Here, for clarity, a cross-sectional slice of the deflector plate 110 is shown. One processing station 106B is also shown along with the center region 108 of the multi-station processing chamber 100, one chamber side wall 102, the chamber bottom 109, the deflector plate 110 cross-sectional slice, the support structure 194, the movement mechanism 195, and a lower portion of the nozzle 112. As noted above, the center region 108 of the multi-station processing chamber 100 is in fluidical connection with each processing station 106A-D. The cleaning chemistry flow 116 through the cavity 124, into two nozzle flowpaths 126, and out the two corresponding nozzle outlets 128 is further illustrated. Although not depicted here, the multi-station processing chamber 100 may include some partial structures around a part of each station to at least partially define a processing station volume; however each such processing station volume is still fluidically connected to the center region 108 to allow the cleaning chemistry to flow from the deflector plate into each station.

Additionally, as also illustrated in FIG. 1C, increasing the offset distance 196 between the nozzle 112 and the deflector plate 110 may also increase the offset distance 197 between the deflector plate 110 and the face 198B of the showerheads in the processing stations. Increasing this offset distance 197 between the deflector plate 110 and the showerhead 107B face 198B in some implementations may result in a more advantageous gas flow angle that can more effectively clean the showerhead face 198B.

In order to direct the cleaning chemistry flow 116 downwards onto the deflector plate, the nozzle flowpath 126 may be oriented in various manners and defined in numerous ways. For example, the nozzle 112 includes a split 111 where the cavity 124 terminates and splits into the nozzle flowpaths 126. The nozzle outlets 128 are positioned radially outwards from the split 111 and cavity 124 by a distance D8 in a direction perpendicular to the center axis 135, and offset from the split 111 and cavity 124 by a distance D9 in a direction parallel to the center axis 135. Each nozzle flowpath 126 extends between the split 111 and cavity 124 to a corresponding nozzle outlet 128 and may do so along various profiles and paths. This may include a linear path or a path having both linear and non-linear, e.g., curved, sections for example.

In some implementations, the nozzle flowpaths may be defined as being oriented at an obtuse angle θ3 with respect to a center axis 139 of the cavity 124. In some embodiments, the angle θ3 may range between about 100 degrees and about 160 degrees. In some instances, this center axis 139 may be collinear, or substantially collinear (e.g., within 10% of collinear), with the center axis 134 of the deflector plate 110. As provided above with respect to FIG. 2F, the nozzle 112 is configured to flow the cleaning chemistry in a general, relative downwards direction, or vector, onto the deflector plate 110 such that this flow has both the vertical directional component 154, i.e., a negative or downwards component, in a direction parallel to the center axis 135 (or to the z-axis) and the horizontal directional component 156 in a direction perpendicular to the center axis 135 (or to the x-axis) and away from the center axis 135.

Further, the angle of the recesses' front surface advantageously directs the cleaning chemistry flow into each processing station which includes the underside face 198B of each station's showerhead (which includes a gas distribution device configured to flow process gases downwards onto a wafer positioned underneath the device). The present inventors found that this angle can affect the cleaning chemistry's flowpath into a station and its cleaning effectiveness. For instance, if the angle is too small then the cleaning chemistry flowpath into the chamber may not intersect enough with the showerhead. If the angle is too large (e.g., approaching orthogonal to the deflector plate center axis), then the cleaning chemistry flowpath into the chamber may be too low under the showerhead and not intersect enough with the showerhead. The angles and configurations provided here are able to clean the processing stations as desired.

In some embodiments, the multi-station processing chamber 100 described herein may include a controller that is configured to control various aspects of the processing chamber and a semiconductor processing tool or apparatus. Referring back to FIG. 1A, an implementation of a system controller 137 employed to control process conditions and hardware states of the multi-station processing chamber 100 and its processing stations is shown. System controller 137 may include one or more memory devices 143, one or more mass storage devices 145, and one or more processors. Processor may include one or more CPUs, ASICs, general-purpose computer(s) and/or specific purpose computer(s), one or more analog and/or digital input/output connection(s), one or more stepper motor controller board(s), etc.

In some implementations, the controller 137 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 137, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controllers provided herein are configured to perform various techniques or processes, such as causing the cleaning chemistry to flow from the cleaning chemistry source, through the nozzle, onto the deflector plate, and into the processing stations concurrently. The controller may also be configured to control the movement mechanism of the support structure 194 to cause relative motion between the deflector plate and nozzle. This includes causing the deflector plate and the nozzle to be offset from each other by a first offset distance and a different, second offset distance.

In some embodiments, a nozzle with one or more deflector surface(s) referred to herein as a "deflector surface nozzle," may be used to direct cleaning chemistry into each station of a multi-station processing chamber. Similar to the previous embodiment, the deflector surface nozzle is positioned in a relatively central location of the processing chamber. The deflector surface nozzle is configured to flow cleaning chemistry from an inlet through an outlet passage onto a deflector surface into various areas of the multi-station processing chamber. The deflector surface nozzle may have the features of a nozzle as described above, but with the additional feature of one or more deflector surface(s). The deflector surface nozzle includes an inlet for receiving cleaning chemistry and a riser passage that splits into a plurality of outlet passages configured to flow the cleaning chemistry on the one or more deflector surfaces of the nozzle, thereby changing the flow path of the cleaning chemistry gas flow so as to be directed radially outward and closer to the showerheads of each station.

Figure 5:
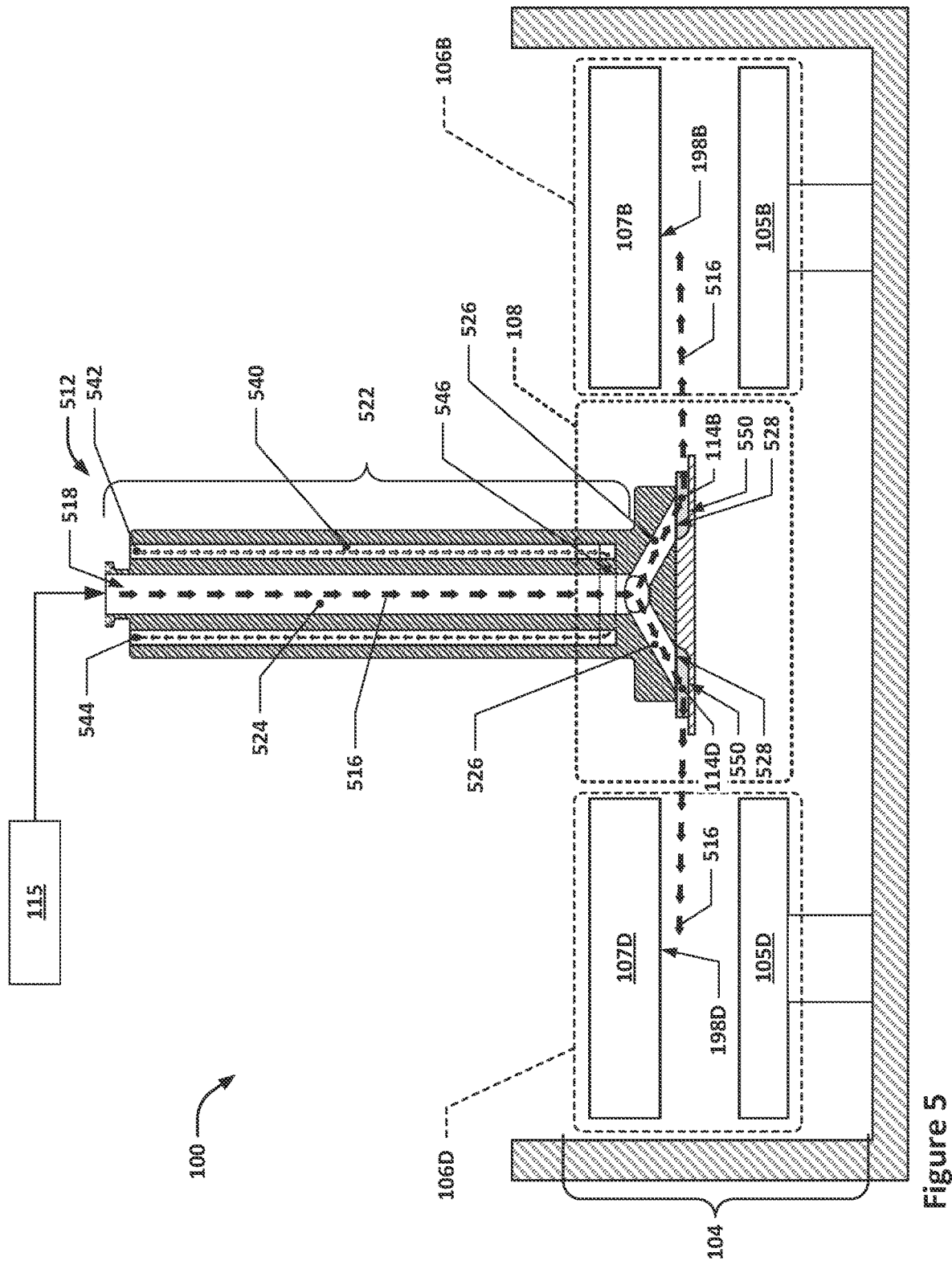
FIG. 5 depicts a cross-sectional side view of the processing chamber of FIG. 1A taken along a corner-to-corner diagonal of the chamber.

FIG. 5 depicts a cross-sectional side view of an alternate implementation of the processing chamber 100 of FIG. 1A taken along a corner-to-corner diagonal of the chamber; the alternate implementation of the processing chamber 100 features a deflector surface nozzle 512. As in FIG. 1B, the side walls and bottom 120 of the multi-station processing chamber 100 are shown, and for clarity, the top portion of the multi-station processing chamber 100 is not shown. Similarly, two processing stations are illustrated, which may be considered the stations across from each other with respect to the center of the multi-station processing chamber 100, such as processing stations 106B and 106D as shown, or processing stations 106A and 106C. Each processing station 106B and 106D includes a pedestal 105B and 105D, respectively, and a showerhead 107B and 107D, respectively. Each showerhead 107B and 107D has a face 198B and 198D that faces the pedestal 105B and 105D, respectively, and it is this face, among other surfaces, onto which the apparatuses herein are configured to flow cleaning chemistry. The deflector surface nozzle 512 may be positioned in the center portion of the chamber 100 such that the one or more deflector surfaces 550 are in the chamber interior 104 and in the center region 108.

Additional features of the deflector surface nozzle 512 are visible, such as a nozzle stem, also referred to herein as a nozzle body 522, with one or more nozzle cavities, also referred to herein as a riser passage or riser passages 524, that fluidically connect the nozzle inlet 518 with a plurality of nozzle flowpaths, also referred to herein as a nozzle outlet passages 526, and a plurality of nozzle outlets 528. In some embodiments, there may be four nozzle outlet passages 526, each with its own nozzle outlet 528. Each nozzle outlet passage 526 may be fluidically connected to the riser passage 524 of the nozzle body 522, span between the riser passage 524 and one corresponding nozzle outlet 528, and fluidically connect one nozzle outlet 528 to the riser passage 524. As indicated by arrows 516, the cleaning chemistry is configured to flow from the cleaning chemistry source 115 into the chamber interior 104 by flowing to and through the nozzle inlet 518, through the riser passage 524, through each nozzle outlet passage 526, and through each nozzle outlet 528. The deflector surface nozzle 512 may have one or more deflector surfaces 550 that are fixed in space relative to the nozzle body 522 and positioned below the plurality of nozzle outlets 528. The deflector surface nozzle 512 is configured to cause the cleaning chemistry to flow out each of the nozzle outlets 528 onto one of the one or more deflector surfaces 550. The cleaning chemistry flows from each nozzle outlet 528 onto the deflector surface 550 through a portion of the chamber interior 104. The deflector surface 550 is further configured to direct and deflect the cleaning chemistry into each processing station, as illustrated by the arrows 516 in FIG. 5.

The deflector surface nozzle 512 of the multi-station processing chamber 100 also includes a nozzle inlet 518 that is configured to be fluidically connected to a cleaning chemistry source 115, such as a remote plasma source that may include a fluorine plasma, for example. The deflector surface nozzle 512 may be configured to receive the cleaning chemistry flowed from the nozzle inlet 518 through the riser passage 524 and out through the nozzle outlet 528 onto each of the deflector surfaces 550 and radially outward into each processing station 106A-D.

Figure 6:
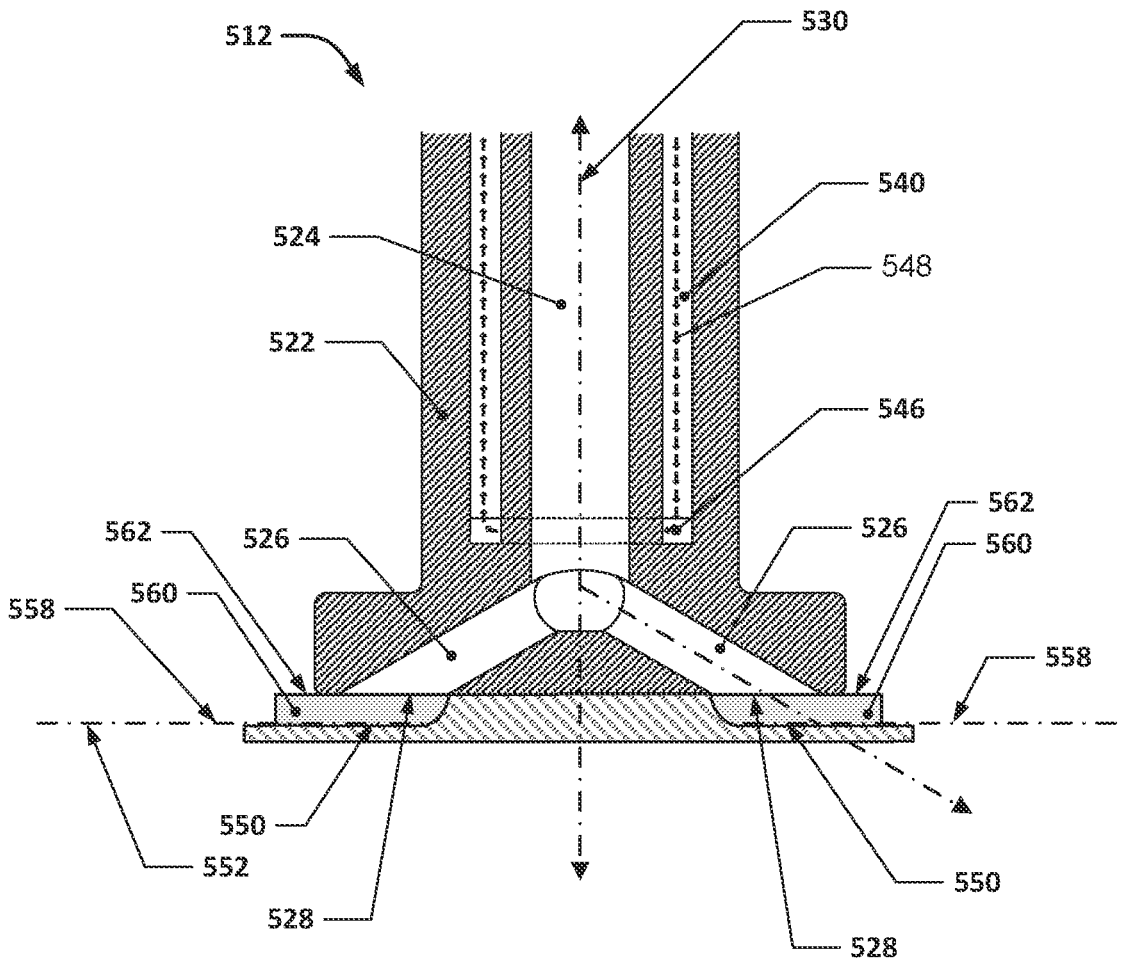
FIG. 6 shows a magnified portion of an example nozzle.

The deflector surface nozzle 512 may also have cooling passage portions 540 within the nozzle body 522. At least one of the cooling passage portions may have a cooling passage inlet 542 at least one of the cooling passages may have a cooling passage outlet 544. As indicated by the arrows 548, coolant is configured to flow to the cooling passage portions 540 via the cooling passage inlet(s) 542, flowed through the cooling passage portions 540, and then out the cooling passage outlet(s) 544, as shown in FIG. 6. In some embodiments, at least one of the cooling passage portions 540 may have an annular or annular sector shape 546. In the embodiment shown, an annular sector 546 portion of the cooling passage portions 540 is adjacent or proximate to the intersection of the riser passage 524 and the nozzle outlet passage 526. In some embodiments, some of the cooling passage portions 540 may flow parallel to the one or more riser passages 524.

FIG. 6 shows a closer view of the bottom half of the deflector surface nozzle 550. Going through the center of the nozzle body 522 is a center axis 530. Each of the nozzle outlet passages 526 is oriented at an oblique angle relative to the center axis 530 away from the nozzle inlet 518. In some embodiments, the oblique angle may be between about 100° to about 160°. The term "between," as used herein and when used with a range of values, is to be understood, unless otherwise indicated, as being inclusive of the start and end values of that range. For example, between 1 and 5 is to be understood to be inclusive of the numbers 1, 2, 3, 4, and 5, not just the numbers 2, 3, and 4.

There are two deflector surfaces 550 shown. The deflector surfaces each have a corresponding outer edge 558. When viewed along the center axis, the outer edge is radially outward of a circle circumscribing the outlet passages 526. In some embodiments, there may be a single deflector surface 550. In some embodiments, there may be a plurality of deflector surfaces, e.g., two deflector surfaces, four deflector surfaces, etc. Also shown are ribs 560, which may separate each of the deflector surfaces 550 from adjacent deflector surfaces. The ribs 560 have a top surface 562. In some embodiments, the top surface 562 is substantially perpendicular to the center axis 530, and may be placed against the underside of the nozzle body 522 (for example, a plate that provides the deflector surfaces, e.g., as shown in FIG. 6, may be clamped to the underside of the nozzle body 522 by a plurality of screws that may be inserted through holes in the plate and threaded into threaded holes in the underside of the nozzle body 522).

A deflector surface reference plane 552 may be used to define the placement of the deflector surface(s) 550. The deflector surface reference plane 552 may be perpendicular to the center axis 530 and is coincident with at least a portion of each of the deflector surfaces 550. In some embodiments, the reference plane 552 may be about 0.10 inches to 0.50 inches away from the nozzle outlets 528. In some embodiments, the reference plane 552 may be about 0.10 inches to 0.20 inches away from the nozzle outlets 528. In some embodiments, the deflector surface may be provided by a ceramic material. In some embodiments, the deflector surface may be provided by a material that includes aluminum, e.g., aluminum, aluminum alloy, etc.

Figures 7A, 7B:
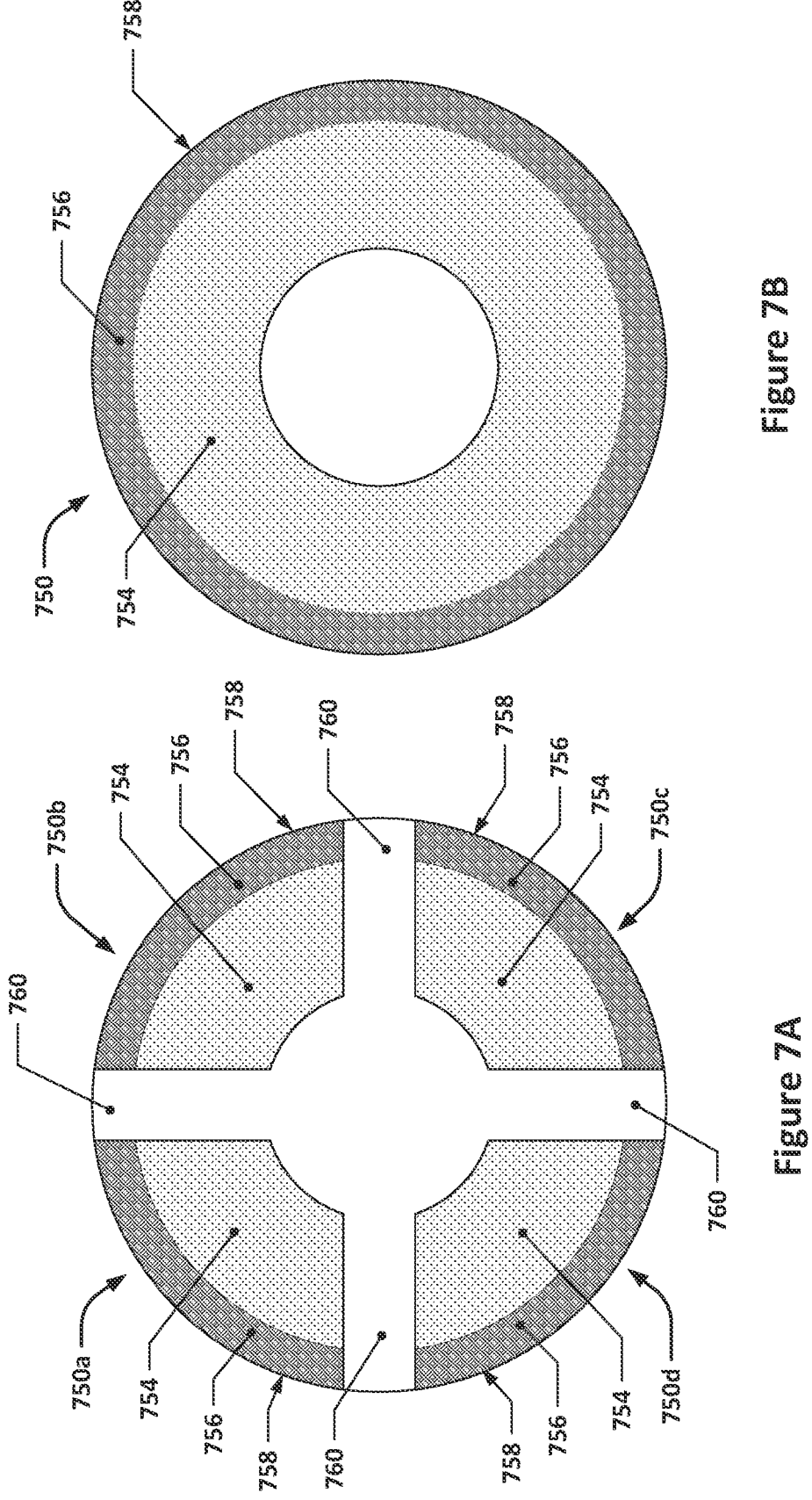
FIGS. 7A and 7B shows a top view of example deflector surfaces.

FIGS. 7A and 7B show top views of two example types of deflector surfaces 750 that may be used on a deflector surface nozzle. FIG. 7A shows four deflector surfaces 750 each with an outer edge 758. Each of the deflector surfaces 750 is separated from the adjacent deflector surface by a rib 760, e.g., such that each rib 760 is circumferentially interposed between an adjacent pair of deflector surfaces 750. Each deflector surface has a bottom surface 754 and a front surface 756. Each front surface 756 is radially outward of and transitions to a corresponding bottom surface 754. When positioned in a multi-station processing tool, the deflector surface nozzle may be positioned such that each deflector surface is oriented towards a corresponding station. In this example, the deflector surface 750 may be used in a four-station chamber. Each of deflector surfaces 750a, 750b, 750c, and 750d, may be positioned to flow cleaning chemistry into a corresponding station within the multi-station chamber.

FIG. 7B shows a top view of an example deflector surface 750, which may be part of a deflector surface nozzle. The deflector surface 750 is a single continuous surface. The deflector surface 750 has a bottom surface 754 and a front surface 756. Similar to the deflector surfaces described above, the front surface 756 is radially outward of and transitions to the bottom surface 754. The single deflector surface 750 does not have impediments that may block the cleaning chemistry flowing on the deflector surface, allowing the cleaning chemistry to flow throughout a processing chamber. However, while this may result in the cleaning chemistry being delivered more evenly throughout the chamber, this may result in less effective cleaning of the processing stations, as the cleaning chemistry may not be focused more on those areas over others, as may be the case when using deflector surfaces that are separated by ribs as in FIG. 7A.

Figures 8A, 8B:
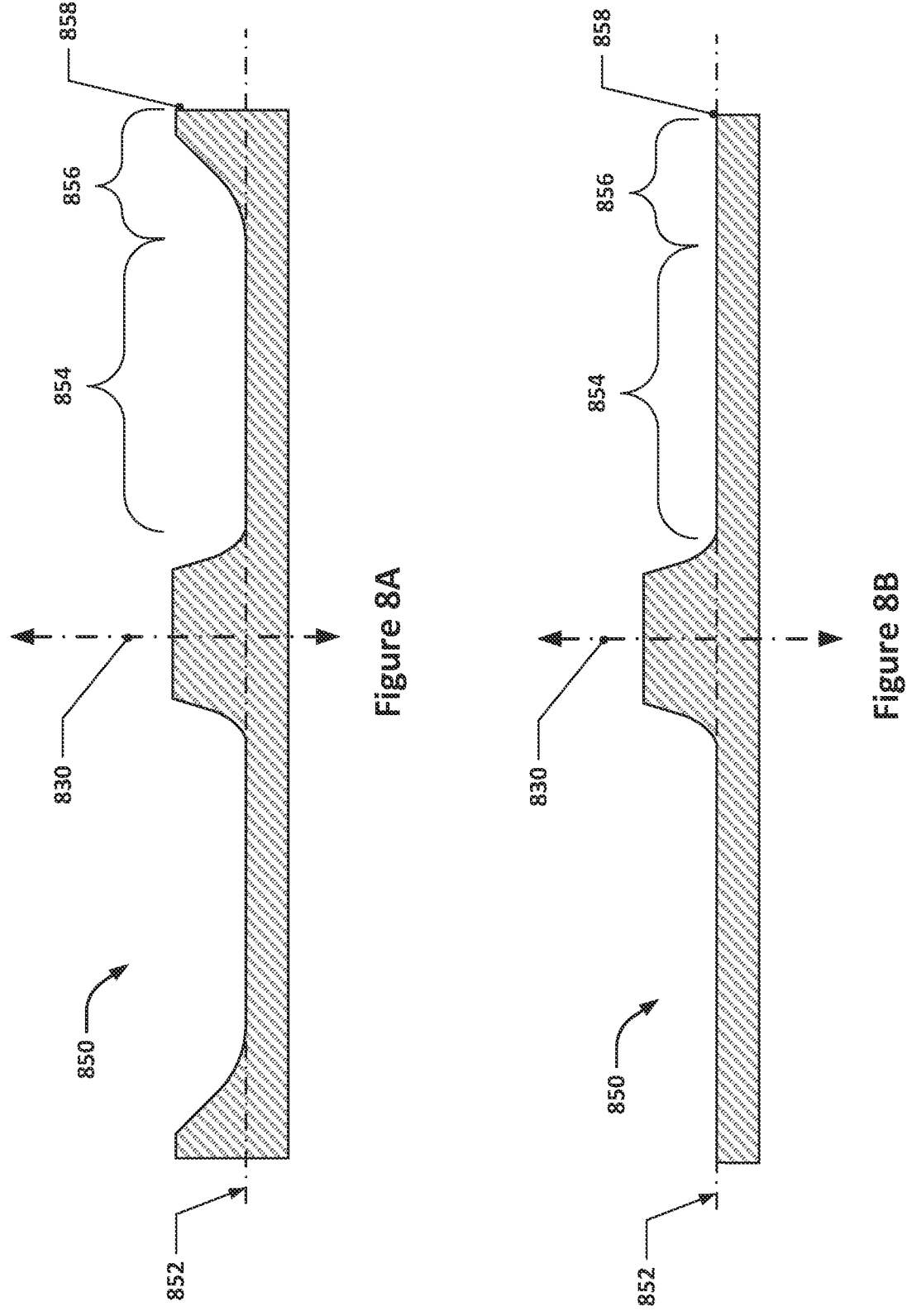
FIGS. 8A and 8B shows a cross-sectional side view of example deflector surfaces.

FIGS. 8A and 8B depict cross-sectional side views of example deflector surfaces 850. Each figure shows a deflector surface 850. The deflector surface 850 has a bottom surface 854 and a front surface 856. The front surface 856 spans between the bottom surface 854 and an outer edge 858 of the deflector surface 850. The outer edge 858 is positioned radially outwards from the bottom surface 854 and is positioned farther away from a center axis 830 than the bottom surface 854. The front surface 856 spans between the outer edge 858 and the bottom surface 854 and may do so along various profiles and paths. This may include a linear path or a path having both linear and non-linear, e.g., curved, sections. In some embodiments, the bottom surface 854 may be substantially perpendicular to the center axis.

FIG. 8A shows a first example of a deflector surface 850. In this example, the front surface 856 has a profile featuring two linear sections, a horizontal section and a slope section, and a curved section. In some embodiments, at least a portion of the front surface 856 is at an oblique angle relative to the center axis 830. In some embodiments, the front surface 856 may have a portion that is between about 120 degrees to about 170 degrees from a deflector surface reference plane 852 that is substantially perpendicular to the center axis 830. In the embodiment shown in FIG. 8A, the front surface 856 has a curved surface. The curved surface may be convex relative to the center axis 830. In some embodiments, the curved surface may have a radius between about 0.1 inches and about 1 inch. FIG. 8B shows a second example of a deflector surface 850 where the front surface 856 is planar. In the embodiment shown, the front surface 856 and the bottom surface 854 are coplanar with the deflector surface reference plane 852.

Results

Figure 3B:
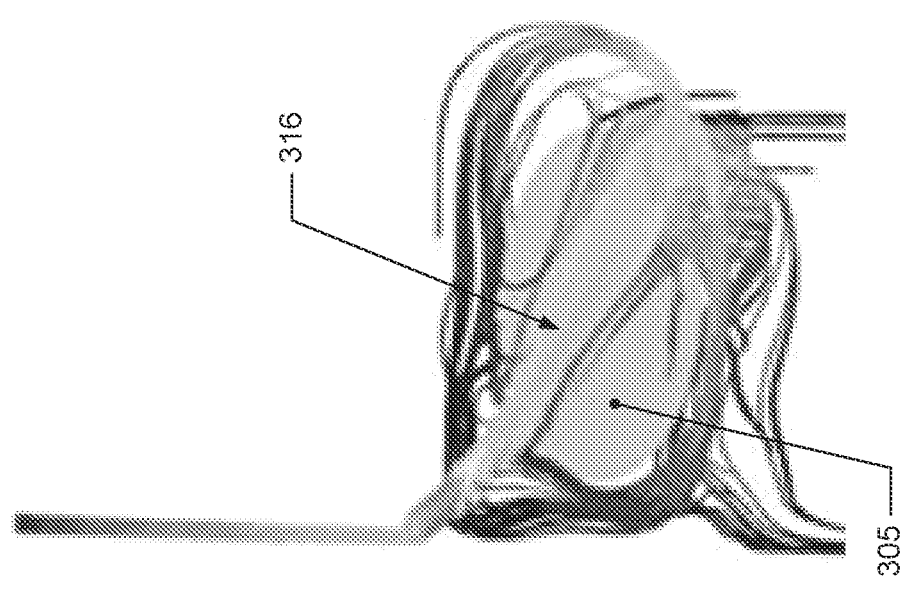
FIG. 3B depicts an off-angle view of FIG. 3A.
Figure 3A:
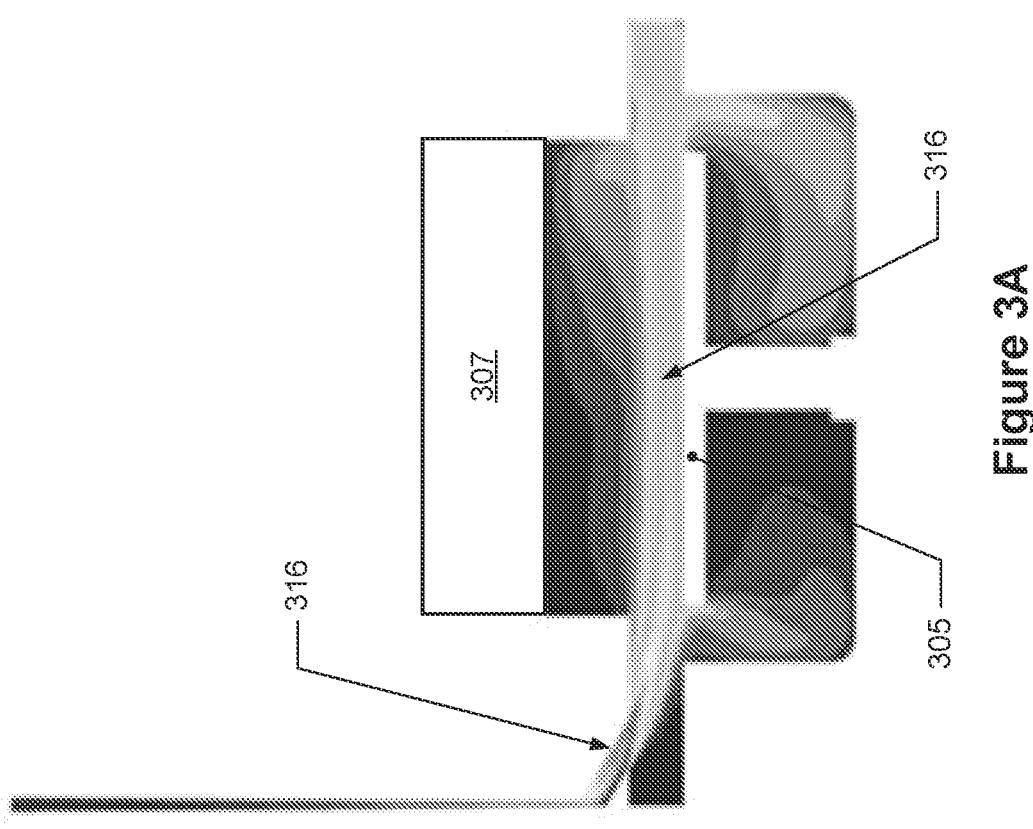
FIG. 3A depicts a mass fraction contour map of a cleaning chemistry flow into a processing station without the use of a deflector plate.

The present inventors discovered that without an adequate upwards angle into the processing station, the cleaning chemistry would not provide the desired cleaning of the processing stations. For example, FIG. 3A depicts a mass fraction contour map of a cleaning chemistry flow into a processing station without the use of a deflector plate as described herein. FIG. 3B depicts an off-angle view of FIG. 3A. Here, a plate underneath the nozzle was used without any recesses or recesses with angled front surfaces. As can be seen, the cleaning chemistry 316 did not flow upwards towards the showerhead 307 in the processing station and remained in a narrow stream close to the pedestal surface 305 thereby not cleaning many aspects of the processing station.

Figure 4B:
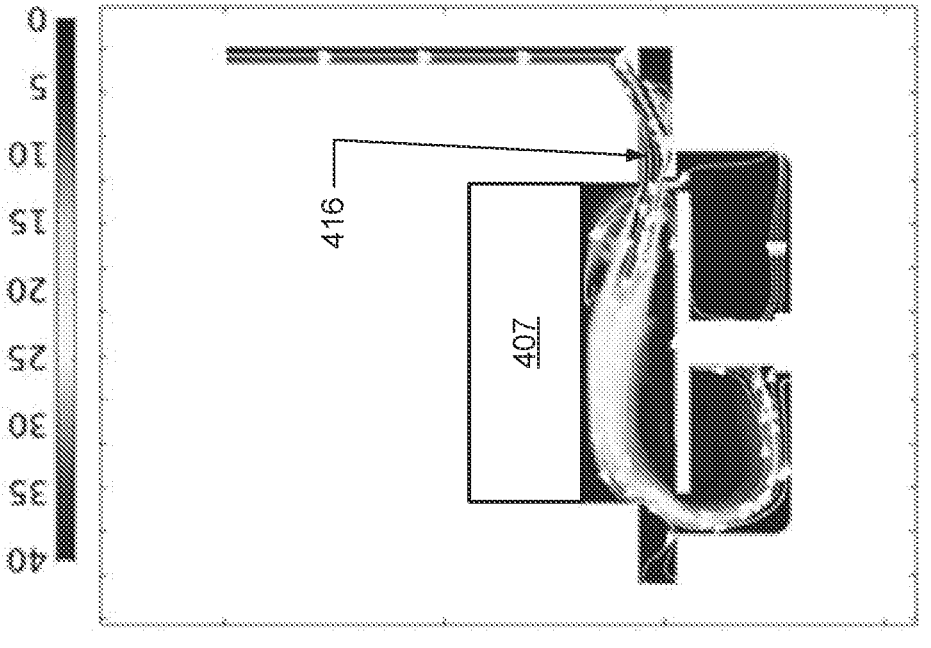
FIGS. 4A-D depict a mass fraction contour map of a cleaning chemistry flow into a processing station with the use of a deflector plate and nozzle as described herein.
Figure 4A:
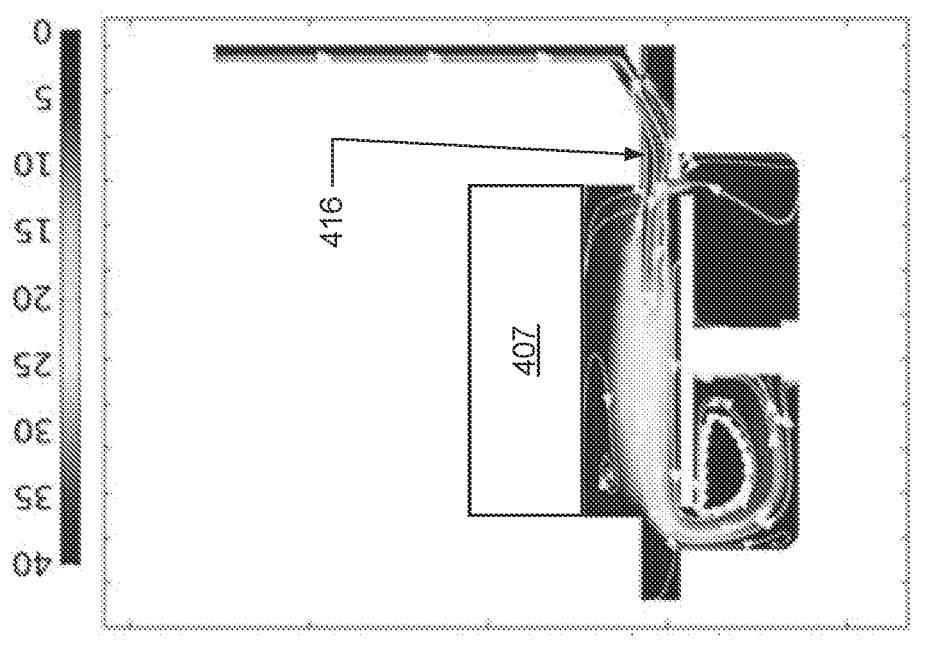
Figure 4D:
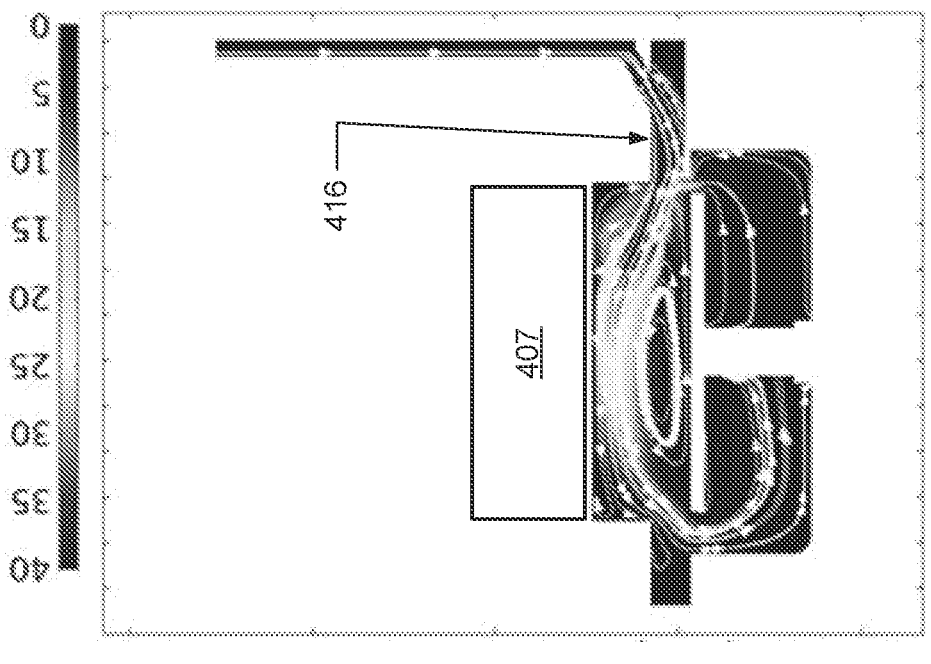
Figure 4C:
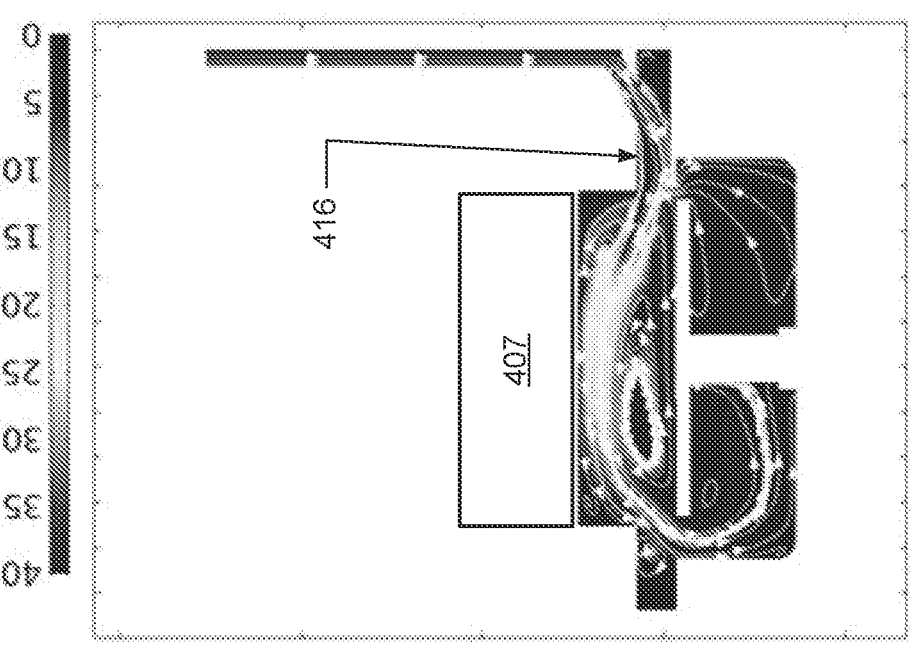

In contrast, FIGS. 4A-D depict a mass fraction contour map of a cleaning chemistry flow into a processing station with the use of a deflector plate and nozzle as described herein. In these figures, various angles of the recess front surface are used. In FIG. 4A, the angle θ1 of the recess front surface is about 75 degrees, in FIG. 4B, the angle θ1 of the recess front surface is about 65 degrees, in FIG. 4C, the angle θ1 of the recess front surface is about 45 degrees, and in FIG. 4D, the angle θ1 of the recess front surface is about 30 degrees. As can be seen, once the angle has decreased to between about 65 degrees and about 30 degrees, the deflector plate sufficiently directed the cleaning chemistry onto the showerhead 407 and thereby was able to clean the showerhead to a desired amount.

It is to be understood that the use of ordinal indicators, e.g., (a), (b), (c), . . . , herein is for organizational purposes only, and is not intended to convey any particular sequence or importance to the items associated with each ordinal indicator. For example, "(a) obtain information regarding velocity and (b) obtain information regarding position" would be inclusive of obtaining information regarding position before obtaining information regarding velocity, obtaining information regarding velocity before obtaining information regarding position, and obtaining information regarding position simultaneously with obtaining information regarding velocity. There may nonetheless be instances in which some items associated with ordinal indicators may inherently require a particular sequence, e.g., "(a) obtain information regarding velocity, (b) determine a first acceleration based on the information regarding velocity, and (c) obtain information regarding position"; in this example, (a) would need to be performed (b) since (b) relies on information obtained in (a)-(c), however, could be performed before or after either of (a) or (b).

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Certain features that are described in this specification in the context of separate implementations also can be implemented in combination in a single implementation. Conversely, various features that are described in the context of a single implementation also can be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

It will be understood that the present disclosure includes, but is not limited to, the numbered implementations listed below.

Implementation 1: A deflector plate for use in a semiconductor processing tool, the deflector plate including: a body having a top surface and an underside surface that are on opposite sides of the body; and a plurality of recesses in the top surface and arranged in a radial pattern around a center axis, wherein, for each recess: that recess is at least partially defined by a corresponding bottom surface, a corresponding first side surface, a corresponding second side surface, and a corresponding front surface, the first side surface, the second side surface, and the front surface intersect the bottom surface, the front surface spans between the first side surface and the second side surface, and the front surface spans between the bottom surface and an outer edge of the recess that is radially outwards from the bottom surface in a direction perpendicular to the center axis and farther from the underside surface than the bottom surface in a direction parallel to the center axis.

Implementation 2: The deflector plate of implementation 1, wherein each front surface spans between a corresponding outer edge and a corresponding bottom surface along a first profile having a linear section, a non-linear section, or a combination of at least one linear section and at least one non-linear section.

Implementation 3: The deflector plate of implementation 1, wherein: a corresponding obtuse angle is defined between each front surface facing the center axis and a reference plane that is perpendicular to the center axis, and the obtuse angle is between about 120 degrees and about 170 degrees.

Implementation 4: The deflector plate of implementation 1, wherein the bottom surface is substantially perpendicular to the center axis.

Implementation 5: The deflector plate of implementation 1, wherein the front surface is oriented at an acute angle with respect to the center axis and the front surface facing the center axis.

Implementation 6: The deflector plate of implementation 5, wherein the acute angle is between about 20 degrees and about 80 degrees.

Implementation 7: The deflector plate of implementation 1, wherein: the front surface intersects with the bottom surface at a first edge having a radius, and the radius is between about 1 inch and about 0.1 inches.

Implementation 8: The deflector plate of implementation 1, wherein: the first side surface is oriented with respect to the bottom surface at a first angle, the second side surface is oriented with respect to the bottom surface at the first angle, and the first angle is between about 60 degrees and about 100 degrees.

Implementation 9: The deflector plate of implementation 1, wherein the first side surface and second side surface are substantially parallel to each other.

Implementation 10: The deflector plate of implementation 1, wherein: the first side surface intersects with the bottom surface at a first edge having a second radius, and the second side surface intersects with the bottom surface at a second edge having the second radius.

Implementation 11: The deflector plate of implementation 10, wherein the second radius is between about 0.1 inches and about 0.01 inches.

Implementation 12: The deflector plate of implementation 1, wherein: the first side surface intersects with the front surface at a third edge having a third radius, and the second side surface intersects with the front surface at a fourth edge having the third radius.

Implementation 13: The deflector plate of implementation 12, wherein the third radius is between about 0.1 inches and about 0.01 inches.

Implementation 14: The deflector plate of implementation 1, wherein the front surface is planar.

Implementation 15: The deflector plate of implementation 1, wherein the front surface is curved.

Implementation 16: The deflector plate of implementation 15, wherein the front surface is convex with respect to the center axis.

Implementation 17: The deflector plate of implementation 1, wherein the plurality of recesses includes four recesses substantially equally spaced about the center axis.

Implementation 18: The deflector plate of implementation 1, wherein: each recess is further defined by a first back surface and a second back surface, the first back surface spans between the bottom surface and a first inner edge of the recess that is radially inwards from the bottom surface in a direction perpendicular to the center axis and farther from the underside surface than the bottom surface in a direction parallel to the center axis, and the second back surface spans between the bottom surface and a second inner edge of the recess that is radially inwards from the bottom surface in a direction perpendicular to the center axis and farther from the underside surface than the bottom surface in a direction parallel to the center axis.

Implementation 19: The deflector plate of implementation 1, wherein: each recess is further defined by a first back surface and a second back surface, the first back surface intersects with the first side surface and the bottom surface, the second back surface intersects with the second side surface and the bottom surface, the first back surface and the second back surface are offset from, and do not intersect, each other, the first back surface is oriented at an obtuse angle with respect to the center axis, and the second back surface is oriented at the obtuse angle with respect to the center axis.

Implementation 20: The deflector plate of implementation 19, wherein the obtuse angle is between about 95 degrees and about 165 degrees.

Implementation 21: The deflector plate of implementation 19, wherein: the first back surface intersects with the first side surface at a first corner that is curved, and the second back surface intersects with the second side surface at a second corner that is curved.

Implementation 22: The deflector plate of implementation 1, further including a plurality of channels, wherein: each channel intersects with a corresponding recess, each channel is interposed between the center axis and the corresponding recess, each channel includes a channel bottom surface, a first channel side surface, and a second channel side surface, the first channel side surface intersects with the channel bottom surface and the first back surface of the recess, the second channel side surface intersects with the channel bottom surface and the second back surface of the recess, and the channel bottom surface intersects with the bottom surface of the recess.

Implementation 23: The deflector plate of implementation 22, wherein each channel has a rectangular cross-sectional area.

Implementation 24: The deflector plate of implementation 22, wherein: each recess has a recess width between the first side surface and the second side surface, each channel has a channel width between the first channel side surface and the second channel side surface, and the channel width is less than the recess width.

Implementation 25: The deflector plate of implementation 22, wherein the first back surface spans between the bottom surface and a first inner edge of the recess that is radially inwards from the bottom surface in a direction perpendicular to the center axis and farther from the underside surface than the bottom surface in a direction parallel to the center axis.

Implementation 26: The deflector plate of implementation 1, wherein: each recess is further defined by a back surface, the back surface intersects with and spans between the first side surface and the second side surface, and the back surface spans between the bottom surface and an inner edge of the recess that is radially inwards from the bottom surface in a direction perpendicular to the center axis and farther from the underside surface than the bottom surface in a direction parallel to the center axis.

Implementation 27: The deflector plate of implementation 1, wherein: each recess is further defined by a back surface, the back surface intersects with and spans between the first side surface and the second side surface, the back surface intersects with the bottom surface, and the back surface is oriented at an obtuse angle with respect to the center axis.

Implementation 28: The deflector plate of implementation 1, further including a center through-hole that is centered on the center axis.

Implementation 29: A multi-station semiconductor processing apparatus, including: a processing chamber having a plurality of processing stations positioned therein and arranged in a circular array around a center region; a cleaning gas distribution nozzle positioned in the center region of the processing chamber and having a nozzle inlet, a plurality of nozzle outlets, and a plurality of nozzle flowpaths that fluidically connect each nozzle outlet to the nozzle inlet; and a deflector plate having a plurality of recesses in a top surface, each recess being at least partially defined by a corresponding bottom surface, a corresponding first side surface, a corresponding second side surface, and a corresponding front surface, wherein the front surface spans between the bottom surface and an outer edge of that recess that is radially outwards from the bottom surface in a direction perpendicular to a center axis of the deflector plate and farther from an underside surface of a body than the bottom surface in a direction parallel to the center axis, wherein: the nozzle outlets and the deflector plate are fluidically connected to processing chamber and processing stations, the cleaning gas distribution nozzle is configured to direct a cleaning gas flow onto the deflector plate, and the deflector plate is positioned underneath the cleaning gas distribution nozzle such that a cleaning gas flowed onto each recess is configured to flow into a corresponding processing station.

Implementation 30: The multi-station semiconductor processing apparatus of implementation 29, wherein the deflector plate and cleaning gas distribution nozzle are positioned such that the cleaning gas flowing through the nozzle inlet flows onto each recess and into each processing station.

Implementation 31: The multi-station semiconductor processing apparatus of implementation 29, further including a wafer indexer, wherein the deflector plate is a part of the wafer indexer.

Implementation 32: The multi-station semiconductor processing apparatus of implementation 29, further including a plurality of robot arms that are each configured to handle a wafer, wherein each recess is positioned between two corresponding robot arms.

Implementation 33: The multi-station semiconductor processing apparatus of implementation 29, wherein the cleaning gas distribution nozzle further includes a stem with an inner cavity that fluidically connects the nozzle inlet with the plurality of nozzle outlets.

Implementation 34: The multi-station semiconductor processing apparatus of implementation 33, wherein: each nozzle outlet is positioned radially outwards from the inner cavity in a direction perpendicular to the center axis, each nozzle outlet is positioned offset from the inner cavity in a direction parallel to the center axis, and each nozzle flowpath spans between the inner cavity and a corresponding nozzle outlet.

Implementation 35: The multi-station semiconductor processing apparatus of implementation 29, wherein each nozzle outlet is oriented at an obtuse angle with respect to a center axis of the cleaning gas distribution nozzle.

Implementation 36: The multi-station semiconductor processing apparatus of implementation 35, wherein the obtuse angle is between about 100 degrees and about 160 degrees.

Implementation 37: The multi-station semiconductor processing apparatus of implementation 29, further including a cleaning gas source fluidically connected to the nozzle inlet.

Implementation 38: The multi-station semiconductor processing apparatus of implementation 37, wherein the cleaning gas source is a plasma source.

Implementation 39: The multi-station semiconductor processing apparatus of implementation 38, wherein the cleaning gas includes a fluorine plasma.

Implementation 40: The multi-station semiconductor processing apparatus of implementation 29, further including a vertical movement mechanism configured to: cause relative vertical movement between the cleaning gas distribution nozzle and the deflector plate, cause the cleaning gas distribution nozzle and the deflector plate to be offset from each other by a first distance during a processing operation, and cause the cleaning gas distribution nozzle and the deflector plate to be offset from each other by a second distance large than the first distance during a cleaning operation.

Implementation 41: The multi-station semiconductor processing apparatus of implementation 40, wherein: each processing station has a corresponding substrate support structure and showerhead having a faceplate surface that faces the substrate support structure, and increasing an offset distance between the cleaning gas distribution nozzle and the deflector plate increases a distance between the faceplate surface and the deflector plate.

Implementation 42: The multi-station semiconductor processing apparatus of implementation 40, wherein the second distance is between about 0.75 inches and about 1.25 inches.

Implementation 43: An apparatus for use in semiconductor processing, the apparatus including: a nozzle body; one or more nozzle inlets; a plurality of nozzle outlet passages; and one or more deflector surfaces fixed in space with respect to the nozzle body, wherein: the nozzle body has a center axis, each nozzle outlet passage is fluidically connected to at least one of the one or more nozzle inlets, the plurality of nozzle outlet passages are interposed between the one or more nozzle inlets and the one or more deflector surfaces, the one or more deflector surfaces face towards the one or more nozzle inlets, and each deflector surface has a corresponding outer edge that is radially outward, when viewed along the center axis, of a circle circumscribing the outlet passages.

Implementation 44: The apparatus of implementation 43, wherein each nozzle outlet passage is oriented at an oblique angle with respect to the center axis of the nozzle body oriented away from the nozzle inlet.

Implementation 45: The apparatus of implementation 44, wherein the angle between the center axis and each nozzle outlet passage is about 100 degrees to about 160 degrees.

Implementation 46: The apparatus of implementation 43, wherein the nozzle has four nozzle outlets.

Implementation 47: The apparatus of implementation 43, wherein a cooling passage portion extends through at least part of the nozzle body.

Implementation 48: The apparatus of implementation 47, wherein the cooling passage portion includes a cooling passage inlet and a cooling passage outlet, the cooling passage inlet and the cooling passage outlet are located in the nozzle body and are adjacent to one or more riser passages within the nozzle body, and each of the one or more riser passages is fluidically interposed between at least one of the one or more nozzle inlets and at least one of the plurality of nozzle outlet passages.

Implementation 49: The apparatus of implementation 47 further including one or more nozzle cavities fluidically interposed between at least one of the one or more nozzle inlets and at least one of the plurality of nozzle outlet passages, and the cooling passage portion has an annular or annular sector shape within the nozzle body and is adjacently located to where the plurality of nozzle outlet passages connects to one or more riser passages.

Implementation 50: The apparatus of implementation 43, wherein the deflector surface is provided by a ceramic material.

Implementation 51: The apparatus of implementation 43, wherein the deflector surface is provided by a material including aluminum.

Implementation 52: The apparatus of implementation 43, further including a plurality of ribs, each rib circumferentially interposed between an adjacent pair of deflector surfaces.

Implementation 53: The apparatus of implementation 52, wherein each rib has a top surface that is substantially perpendicular to the center axis.

Implementation 54: The apparatus of implementation 43, wherein a first reference plane is substantially perpendicular to the center axis of the nozzle body and coincident with at least a portion of the deflector surface, and is about 0.10 inches to about 0.50 inches away from a nozzle outlet.

Implementation 55: The apparatus of implementation 43, wherein first reference plane is substantially perpendicular to the center axis of the nozzle body and coincident with at least a portion of the deflection surface, and is about 0.10 inches to about 0.20 inches away from a nozzle outlet.

Implementation 56: The apparatus of implementation 43, wherein each of the one or more deflector surfaces is at least partially defined by a corresponding bottom surface and a corresponding front surface, wherein: the corresponding front surface and the corresponding bottom surface of each deflector surface intersect and the corresponding front surface spans between the outer edge and the corresponding bottom surface of each deflector surface.

Implementation 57: The apparatus of implementation 56, wherein each front surface spans between the outer edge and the corresponding bottom surface along a corresponding first profile oriented at an oblique angle with respect to the center axis, the corresponding first profile of each deflector surface having a linear section, a non-linear section, or a combination of at least one linear section and at least one non-linear section.

Implementation 58: The apparatus of implementation 56, wherein: a corresponding obtuse angle is defined between at least a portion of each front surface facing the center axis and a reference plane that is perpendicular to the center axis, and the obtuse angle is between about 120 degrees and about 170 degrees.

Implementation 59: The apparatus of implementation 56, wherein each corresponding bottom surface is substantially perpendicular to the center axis.

Implementation 60: The apparatus of implementation 56, wherein the front surface intersects with the bottom surface at a first edge having a radius, and the radius is between about 1 inch and 0.1 inches.

Implementation 61: The apparatus of implementation 56, wherein the front surface is planar.

Implementation 62: The apparatus of implementation 56, wherein the front surface is curved.

Implementation 63: The apparatus of implementation 62, wherein the front surface is convex with respect to the center axis.

Implementation 64: The apparatus of any of implementations 43 through 63, further including a processing chamber having a plurality of processing stations arranged in a circular array around a center region, wherein the nozzle body is positioned in the center region.

Implementation 65: The apparatus of implementation 64, wherein the nozzle body is configured to rotate about the center axis relative to the processing chamber.

Implementation 66: The apparatus of implementation 65, wherein the nozzle body is configured to rotate by up to 90°.

Implementation 67: The apparatus of implementation 65, further including a cleaning chemistry source fluidically connected to at least one of the one or more nozzle inlets.

Implementation 68: The apparatus of implementation 67, wherein the cleaning chemistry source is a remote plasma generator configured to generate a plasma.

Implementation 69: The apparatus of implementation 68, wherein the cleaning chemistry includes a plasma formed using at least one or more of fluorine, oxygen, hydrogen, and nitrogen trifluoride.

It is to be understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. An apparatus for facilitating semiconductor processing operations, the apparatus comprising a deflector plate comprising:

a body having a top surface and an underside surface that are on opposite sides of the body; and a plurality of recesses in the top surface and arranged in a radial pattern around a center axis, wherein, for each recess:

that recess is at least partially defined by a corresponding bottom surface, a corresponding first side surface, a corresponding second side surface, and a corresponding front surface, the first side surface, the second side surface, and the front surface intersect the bottom surface, the front surface spans between the first side surface and the second side surface, and the front surface spans between the bottom surface and an outer edge of the recess that is radially outwards from the bottom surface in a direction perpendicular to the center axis and farther from the underside surface than the bottom surface in a direction parallel to the center axis.

2. The apparatus of claim 1, wherein each front surface spans between a corresponding outer edge and a corresponding bottom surface along a first profile having a linear section, a non-linear section, or a combination of at least one linear section and at least one non-linear section.

3. The apparatus of claim 1, wherein:

a corresponding obtuse angle is defined between each front surface facing the center axis and a reference plane that is perpendicular to the center axis, and the obtuse angle is between about 120 degrees and about 170 degrees.

4. The apparatus of claim 1, wherein the bottom surface is substantially perpendicular to the center axis.

5. The apparatus of claim 1, wherein the front surface is oriented at an acute angle with respect to the center axis and the front surface facing the center axis.

6. The apparatus of claim 5, wherein the acute angle is between about 20 degrees and about 80 degrees.

7. The apparatus of claim 1, wherein:

the front surface intersects with the bottom surface at a first edge having a radius, and the radius is between about 1 inch and about 0.1 inches.

8. The apparatus of claim 1, wherein:

the first side surface is oriented with respect to the bottom surface at a first angle, the second side surface is oriented with respect to the bottom surface at the first angle, and the first angle is between about 60 degrees and about 100 degrees.

9. The apparatus of claim 1, wherein the first side surface and second side surface are substantially parallel to each other.

10. The apparatus of claim 1, wherein:

the first side surface intersects with the bottom surface at a first edge having a second radius, and the second side surface intersects with the bottom surface at a second edge having the second radius.

11. The apparatus of claim 1, wherein:

the first side surface intersects with the front surface at a third edge having a third radius, and the second side surface intersects with the front surface at a fourth edge having the third radius.

12. The apparatus of claim 1, wherein the front surface is convex with respect to the center axis, planar, or curved.

13. The apparatus of claim 1, wherein the plurality of recesses includes four recesses substantially equally spaced about the center axis.

14. The apparatus of claim 1, wherein:

each recess is further defined by a first back surface and a second back surface, the first back surface spans between the bottom surface and a first inner edge of the recess that is radially inwards from the bottom surface in a direction perpendicular to the center axis and farther from the underside surface than the bottom surface in a direction parallel to the center axis, and the second back surface spans between the bottom surface and a second inner edge of the recess that is radially inwards from the bottom surface in a direction perpendicular to the center axis and farther from the underside surface than the bottom surface in a direction parallel to the center axis.

15. The apparatus of claim 1, wherein:

each recess is further defined by a first back surface and a second back surface, the first back surface intersects with the first side surface and the bottom surface, the second back surface intersects with the second side surface and the bottom surface, the first back surface and the second back surface are offset from, and do not intersect, each other, the first back surface is oriented at an obtuse angle with respect to the center axis, and the second back surface is oriented at the obtuse angle with respect to the center axis.

16. The apparatus of claim 15, wherein:

the obtuse angle is between about 95 degrees and about 165 degrees, or the second back surface intersects with the second side surface at a second corner that is curved.

17. The apparatus of claim 14, further comprising a plurality of channels, wherein:

each channel intersects with a corresponding recess, each channel is interposed between the center axis and the corresponding recess, each channel includes a channel bottom surface, a first channel side surface, and a second channel side surface, the first channel side surface intersects with the channel bottom surface and the first back surface of the recess, the second channel side surface intersects with the channel bottom surface and the second back surface of the recess, and the channel bottom surface intersects with the bottom surface of the recess.

18. The apparatus of claim 17, wherein:

each channel has a rectangular cross-sectional area;

each recess has a recess width between the first side surface and the second side surface, each channel has a channel width between the first channel side surface and the second channel side surface, and the channel width is less than the recess width; or the first back surface spans between the bottom surface and a first inner edge of the recess that is radially inwards from the bottom surface in a direction perpendicular to the center axis and farther from the underside surface than the bottom surface in a direction parallel to the center axis.

19. The apparatus of claim 1, wherein:

each recess is further defined by a back surface, the back surface intersects with and spans between the first side surface and the second side surface, and the back surface spans between the bottom surface and an inner edge of the recess that is radially inwards from the bottom surface in a direction perpendicular to the center axis and farther from the underside surface than the bottom surface in a direction parallel to the center axis.

20. The apparatus of claim 1, wherein:

each recess is further defined by a back surface, the back surface intersects with and spans between the first side surface and the second side surface, the back surface intersects with the bottom surface, and the back surface is oriented at an obtuse angle with respect to the center axis.

21. The apparatus of claim 1, further comprising a center through-hole that is centered on the center axis.

22. The apparatus of claim 1, further comprising:

a processing chamber having a plurality of processing stations positioned therein and arranged in a circular array around a center region; and a cleaning gas distribution nozzle positioned in the center region of the processing chamber and having a nozzle inlet, a plurality of nozzle outlets, and a plurality of nozzle flowpaths that fluidically connect each nozzle outlet to the nozzle inlet, wherein:

the cleaning gas distribution nozzle is configured to direct a cleaning gas flow onto the deflector plate via the nozzle outlets when cleaning gas is flowed into the nozzle inlet, and the deflector plate is positioned underneath the cleaning gas distribution nozzle such that a cleaning gas flowed onto each recess then flows into a corresponding processing station.

23. The apparatus of claim 22, wherein the deflector plate and cleaning gas distribution nozzle are positioned such that the cleaning gas flowing through the nozzle inlet flows onto each recess and into each processing station.

24. The apparatus of claim 22, further comprising a wafer indexer, wherein the deflector plate is a part of the wafer indexer.

25. The apparatus of claim 22, further comprising a plurality of robot arms that are each configured to handle a wafer, wherein each recess is positioned between two corresponding robot arms.

26. The apparatus of claim 22, wherein the cleaning gas distribution nozzle further includes a stem with an inner cavity that fluidically connects the nozzle inlet with the plurality of nozzle outlets.

27. The apparatus of claim 26, wherein:

each nozzle outlet is positioned radially outwards from the inner cavity in a direction perpendicular to the center axis, each nozzle outlet is positioned offset from the inner cavity in a direction parallel to the center axis, and each nozzle flowpath spans between the inner cavity and a corresponding nozzle outlet.

28. The apparatus of claim 22, wherein each nozzle outlet is oriented at an obtuse angle with respect to a center axis of the cleaning gas distribution nozzle.

29. The apparatus of claim 22, wherein one or both of the cleaning gas distribution nozzle and the deflector plate are movable between:

a first configuration in which the cleaning gas distribution nozzle and the deflector plate are offset from each other by a first distance during a processing operation, and a second configuration in which the cleaning gas distribution nozzle and the deflector plate are offset from each other by a second distance larger than the first distance during a cleaning operation.

30. The apparatus of claim 29, wherein:

each processing station has a corresponding substrate support structure and showerhead having a faceplate surface that faces the substrate support structure, and increasing an offset distance between the cleaning gas distribution nozzle and the deflector plate increases a distance between the faceplate surface and the deflector plate.

* * * * *